US008847376B2

(12) United States Patent
Oganesian et al.

(10) Patent No.: US 8,847,376 B2
(45) Date of Patent: Sep. 30, 2014

(54) MICROELECTRONIC ELEMENTS WITH POST-ASSEMBLY PLANARIZATION

(75) Inventors: Vage Oganesian, Palo Alto, CA (US); Belgacem Haba, Saratoga, CA (US); Craig Mitchell, San Jose, CA (US); Ilyas Mohammed, Santa Clara, CA (US); Piyush Savalia, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 12/842,587

(22) Filed: Jul. 23, 2010

(65) Prior Publication Data
US 2012/0020026 A1  Jan. 26, 2012

(51) Int. Cl.
*H01L 23/045* (2006.01)
(52) U.S. Cl.
USPC ............. 257/686; 257/E25.03; 257/E23.169; 438/106; 438/107
(58) Field of Classification Search
CPC ..................................................... H01L 23/045
USPC ............. 257/E25.03, E23.169, 686; 438/106, 438/107
See application file for complete search history.

(56) References Cited

U.S. PATENT DOCUMENTS

| 5,377,902 | A | 1/1995 | Hayes | |
|---|---|---|---|---|
| 6,172,423 | B1 * | 1/2001 | Lee | 257/780 |
| 6,188,127 | B1 * | 2/2001 | Senba et al. | 257/686 |
| 6,376,769 | B1 | 4/2002 | Chung | |
| 6,541,712 | B1 * | 4/2003 | Gately et al. | 174/266 |
| 7,244,633 | B1 * | 7/2007 | Kuang | 438/107 |
| 7,550,830 | B2 * | 6/2009 | Yoon | 257/678 |
| 7,999,366 | B2 * | 8/2011 | Bouche et al. | 257/678 |
| 8,426,961 | B2 | 4/2013 | Shih et al. | |
| 2002/0008325 | A1 * | 1/2002 | Tominaga | 257/778 |
| 2002/0036338 | A1 * | 3/2002 | Matsuo et al. | 257/686 |
| 2002/0072189 | A1 | 6/2002 | Haroun et al. | |

(Continued)

FOREIGN PATENT DOCUMENTS

| JP | 10308477 | 11/1998 |
|---|---|---|
| JP | 2006060024 A | 3/2006 |

(Continued)

OTHER PUBLICATIONS

International Search Report and Written Opinion, PCT/US2010/052792, dated Feb. 3, 2011.

(Continued)

*Primary Examiner* — Fernando L Toledo
*Assistant Examiner* — Peter Bradford
(74) *Attorney, Agent, or Firm* — Lerner, David, Littenberg, Krumholz & Mentlik, LLP

(57) ABSTRACT

A microelectronic unit includes a carrier structure having a front surface, a rear surface remote from the front surface, and a recess having an opening at the front surface and an inner surface located below the front surface of the carrier structure. The microelectronic unit can include a microelectronic element having a bottom surface adjacent the inner surface, a top surface remote from the bottom surface, and a plurality of contacts at the top surface. The microelectronic element can include terminals electrically connected with the contacts of the microelectronic element. The microelectronic unit can include a dielectric region contacting at least the top surface of the microelectronic element. The dielectric region can have a planar surface located coplanar with or above the front surface of the carrier structure. The terminals can be exposed at the surface of the dielectric region for interconnection with an external element.

28 Claims, 18 Drawing Sheets

(56) References Cited

U.S. PATENT DOCUMENTS

| | | | |
|---|---|---|---|
| 2002/0105073 A1 | 8/2002 | Smith | |
| 2002/0127780 A1 | 9/2002 | Ma et al. | |
| 2003/0119692 A1 | 6/2003 | So et al. | |
| 2004/0155347 A1 | 8/2004 | Ho et al. | |
| 2004/0222508 A1* | 11/2004 | Aoyagi | 257/686 |
| 2004/0222510 A1* | 11/2004 | Aoyagi | 257/686 |
| 2004/0222534 A1* | 11/2004 | Sawamoto et al. | 257/778 |
| 2005/0006784 A1* | 1/2005 | Nakayama | 257/777 |
| 2005/0101056 A1* | 5/2005 | Song et al. | 438/109 |
| 2005/0205977 A1 | 9/2005 | Zilber et al. | |
| 2005/0224968 A1* | 10/2005 | Ho | 257/737 |
| 2005/0269680 A1* | 12/2005 | Hsuan | 257/686 |
| 2006/0086899 A1* | 4/2006 | Chao et al. | 250/239 |
| 2006/0131719 A1* | 6/2006 | Nakayama | 257/686 |
| 2006/0278962 A1 | 12/2006 | Gibson | |
| 2007/0035015 A1* | 2/2007 | Hsu | 257/723 |
| 2007/0096289 A1* | 5/2007 | Enomoto et al. | 257/687 |
| 2007/0152319 A1 | 7/2007 | Takiar et al. | |
| 2007/0210423 A1* | 9/2007 | Hsu | 257/668 |
| 2007/0284729 A1 | 12/2007 | Kwon et al. | |
| 2008/0054443 A1* | 3/2008 | Shih | 257/698 |
| 2008/0099900 A1 | 5/2008 | Oganesian et al. | |
| 2008/0246136 A1 | 10/2008 | Haba et al. | |
| 2009/0039527 A1 | 2/2009 | Chan et al. | |
| 2009/0115047 A1* | 5/2009 | Haba et al. | 257/690 |
| 2009/0200652 A1* | 8/2009 | Oh et al. | 257/686 |
| 2009/0311828 A1* | 12/2009 | Andry et al. | 438/107 |
| 2011/0147911 A1* | 6/2011 | Kohl et al. | 257/686 |
| 2011/0241040 A1* | 10/2011 | Yu et al. | 257/91 |

FOREIGN PATENT DOCUMENTS

| | | |
|---|---|---|
| JP | 2008109046 A | 5/2008 |
| JP | 2008130934 A | 6/2008 |
| JP | 2009231371 A | 10/2009 |
| TW | I263313 | 10/2006 |

OTHER PUBLICATIONS

Office Action for Taiwan Application No. 099140235 dated Nov. 28, 2013.

Taiwanese Office Action for Application No. 099140235 dated Apr. 2, 2014.

Japanese Office Action for Application No. 2013-521758 dated Apr. 15, 2014.

* cited by examiner

MICROELECTRONIC ELEMENTS WITH POST-ASSEMBLY PLANARIZATION

BACKGROUND OF THE INVENTION

The present invention relates to packaging of microelectronic devices, especially the packaging of semiconductor devices. The present invention also relates to stacked microelectronic packages including stacked microelectronic packages fabricated at the wafer level and to methods of making such packages.

Microelectronic elements generally comprise a thin slab of a semiconductor material, such as silicon or gallium arsenide, commonly called a die or a semiconductor chip. Semiconductor chips are commonly provided as individual, prepackaged units. The active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, around 0.5 µm thick. The bond pads could include a single layer or multiple layers of metal. The size of the bond pads will vary with the device type but will typically measure tens to hundreds of microns on a side.

In some unit designs, the semiconductor chip is mounted to a substrate or chip carrier, which is in turn mounted on a circuit panel, such as a printed circuit board. Semiconductor chips are typically packaged with substrates to form microelectronic packages having terminals that are electrically connected to the chip contacts. The package may then be connected to test equipment to determine whether the packaged device conforms to a desired performance standard. Once tested, the package may be connected to a larger circuit, e.g., a circuit in an electronic product such as a computer or a cell phone.

In order to save space, certain conventional designs have stacked multiple microelectronic chips within a package. This allows the package to occupy a surface area on a substrate that is less than the total surface area of the chips in the stack. However, conventional stacked packages have disadvantages of complexity, cost, thickness and testability.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections should be short and should have low impedance to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

In spite of the above advances, there remains a need for improved semiconductor device and carrier packages and stacked packages that are reliable, thin, testable, and that are economical to manufacture. These attributes of the present invention are achieved by the construction of the microelectronic packages as described hereinafter.

SUMMARY OF THE INVENTION

In accordance with an aspect of the invention, a microelectronic unit includes a carrier structure having a front surface, a rear surface remote from the front surface, and a recess having an opening at the front surface and an inner surface located below the front surface of the carrier structure. The carrier structure can include at least one of semiconductor material or glass. The microelectronic unit can also include a microelectronic element having a bottom surface adjacent the inner surface, a top surface remote from the bottom surface, and a plurality of contacts at the top surface.

The microelectronic unit can also include terminals electrically connected with the contacts of the microelectronic element. The terminals can be electrically insulated from the carrier structure. The microelectronic unit can also include a dielectric region contacting at least the top surface of the microelectronic element. The dielectric region can have a planar surface located coplanar with or above the front surface of the carrier structure. The terminals can be exposed at the surface of the dielectric region for interconnection with an external element.

In a particular embodiment, the terminals can be exposed at the front surface of the carrier structure. In one embodiment, the terminals can extend above the front surface of the carrier structure. In an exemplary embodiment, the microelectronic element can have at least one edge surface between the top and bottom surfaces, and a location of at least one of the terminals in a lateral direction of the planar surface can be between the edge surface of the microelectronic element and a surface of the carrier structure which bounds the recess.

In one embodiment, the terminals can include conductive bond pads. In an exemplary embodiment, the terminals can include extended bond pads. The extended bond pads can contact the contacts of the microelectronic element. In a particular embodiment, the carrier structure can include an outer metal finish layer, such that the carrier structure is adapted to function as a heat spreader. In one embodiment, a dielectric material can cover the entire front surface of the carrier structure.

In an exemplary embodiment, the carrier structure can include a semiconductor material and the dielectric region can be an electrochemically deposited polymer. In a particular embodiment, the carrier structure can include glass and a spray-coated or spin-coated compliant dielectric material can cover the inner surface of the recess. In one embodiment, the microelectronic unit can also include a plurality of conductive vias extending from the rear surface to the front surface of the carrier structure.

In a particular embodiment, each via can have a first width at the rear surface of the carrier structure and a second width at an opposite end, the second width being different than the first width. In one embodiment, the terminals can include extended bond pads, and each bond pad can electrically connect a respective via to a respective contact of the microelectronic element. In an exemplary embodiment, the dielectric region can extend between sidewalls of the recess and the microelectronic element. In a particular embodiment, the microelectronic unit can also include a plurality of conductive vias extending from a major surface of the dielectric region through the carrier structure to the rear surface. In a particular embodiment, each via can have a first width at the rear surface of the carrier structure and a second width at an opposite end, the second width being different than the first width. In one embodiment, the terminals can include extended bond pads, and each bond pad can electrically connect a respective via to a respective contact of the microelectronic element.

In one embodiment, a microelectronic assembly can include at least first and second microelectronic units, the first microelectronic unit being stacked with the second microelectronic unit, with the contacts of the respective microelectronic elements therein being electrically connected through the terminals of the first and second microelectronic units. In an exemplary embodiment, the first microelectronic unit can include first terminals exposed at the rear surface of a first carrier structure, the second microelectronic unit can include second terminals exposed at the front surface of a second carrier structure, and the first microelectronic element can be electrically connected to the second microelectronic element through the first and second terminals. In a particular embodiment, the first carrier structure can include a first recess having a first width in a lateral direction along its front surface, and the second carrier structure can include a second recess defining a second width in the lateral direction along its front surface, the second width being different than the first width.

In an exemplary embodiment, the microelectronic element can be a first microelectronic element. The microelectronic unit can also include a second microelectronic element having a bottom surface adjacent the inner surface of the recess, a top surface remote from the bottom surface, and a plurality of contacts at the top surface. In one embodiment, the recess can be a first recess, the microelectronic element can be a first microelectronic element, and the carrier structure can have a second recess having an opening at the front surface and an inner surface located below the front surface of the carrier structure. The microelectronic element can also include a second microelectronic element having a bottom surface adjacent the inner surface of the second recess, a top surface remote from the bottom surface, and a plurality of contacts at the top surface.

In accordance with an aspect of the invention, a microelectronic unit includes a carrier structure having a front surface, a rear surface remote from the front surface, and a recess having an opening at the front surface and an inner surface located below the front surface of the carrier structure. The carrier structure can include at least one of semiconductor material or glass. The microelectronic unit can also include a microelectronic element having a top surface adjacent the inner surface, a bottom surface remote from the top surface, and a plurality of contacts at the top surface.

The microelectronic unit can also include terminals electrically connected with the contacts of the microelectronic element. The terminals can be electrically insulated from the carrier structure. The microelectronic unit can also include a dielectric region contacting at least the bottom surface of the microelectronic element. The dielectric region can define a planar surface located coplanar with or above the front surface of the carrier structure.

In a particular embodiment, the microelectronic element can have at least one edge surface between the top and bottom surfaces, and a location of at least one of the terminals in a lateral direction of the planar surface can be between the edge surface of the microelectronic element and a surface of the carrier structure which bounds the recess. In one embodiment, the bottom surface of the microelectronic element can be coplanar with the front surface of the carrier structure. In an exemplary embodiment, the terminals can be exposed at the front surface of the carrier structure. In a particular embodiment, the terminals can extend above the front surface of the carrier structure.

In one embodiment, the terminals can include conductive bond pads. In an exemplary embodiment, the terminals can include extended bond pads. The extended bond pads can contact conductors extending within the recess to the contacts of the microelectronic element. In a particular embodiment, the carrier structure can include an outer metal finish layer, such that the carrier structure is adapted to function as a heat spreader. In one embodiment, a dielectric material can cover the entire front surface of the carrier structure.

In an exemplary embodiment, the carrier structure can include a semiconductor material and the dielectric region can be an electrochemically deposited polymer. In a particular embodiment, the carrier structure can include glass and a spray-coated or spin-coated compliant dielectric material can cover the inner surface of the recess. In one embodiment, the microelectronic unit can also include a plurality of conductive vias extending from the rear surface of the carrier structure to the inner surface.

In a particular embodiment, each via can have a first width at the rear surface of the carrier structure and a second width at an opposite end, the second width being different than the first width. In one embodiment, the terminals can include extended bond pads, and each bond pad can electrically connect a respective via to a respective contact of the microelectronic element. In an exemplary embodiment, the microelectronic unit can also include a plurality of conductive vias extending from the rear surface to the front surface of the carrier structure. In one embodiment, each via can have a first width at the rear surface of the carrier structure and a second width at an opposite end, the second width being different than the first width. In a particular embodiment, the terminals can include extended bond pads, and each bond pad can electrically connect a respective via to a respective contact of the microelectronic element.

In one embodiment, the dielectric region can extend between sidewalls of the recess and the microelectronic element. In an exemplary embodiment, the microelectronic element can also include a plurality of conductive vias extending from a major surface of the dielectric region through the carrier structure to the rear surface. In one embodiment, each via can have a first width at the rear surface of the carrier structure and a second width at an opposite end, the second width being different than the first width. In a particular embodiment, the terminals can include extended bond pads, and each bond pad can electrically connect a respective via to a respective contact of the microelectronic element.

In an exemplary embodiment, a microelectronic assembly can include at least first and second microelectronic units. The first microelectronic unit can be stacked with the second microelectronic unit, with the contacts of the respective microelectronic elements therein being electrically connected through the terminals of the first and second microelectronic units. In a particular embodiment, the first microelectronic unit can include first terminals exposed at the rear surface of a first carrier structure, the second microelectronic unit can include second terminals exposed at the front surface of a second carrier structure, and the first microelectronic element can be electrically connected to the second microelectronic element through the first and second terminals.

In one embodiment, the first carrier structure can include a first recess having a first width in a lateral direction along its front surface, and the second carrier structure can include a second recess defining a second width in the lateral direction along its front surface, the second width being different than the first width. In an exemplary embodiment, the microelectronic element can be a first microelectronic element. The microelectronic unit can further include a second microelectronic element having a top surface adjacent the inner surface of the recess, a bottom surface remote from the top surface, and a plurality of contacts at the top surface.

In a particular embodiment, the recess can be a first recess having an opening at the front surface and an inner surface located below the front surface of the carrier structure. The microelectronic unit can also include a second microelectronic element having a top surface adjacent the inner surface of the second recess, a bottom surface remote from the top surface, and a plurality of contacts at the top surface.

In accordance with an aspect of the invention, a microelectronic unit includes a carrier structure having a front surface, a rear surface remote from the front surface, and an opening extending through the carrier structure from the front surface to the rear surface. The carrier structure can include at least one of semiconductor material or glass. The microelectronic unit can also include a microelectronic element having edge surfaces adjacent lateral edge surfaces of the opening, a top surface remote from the bottom surface, and a plurality of contacts at the top surface.

The microelectronic unit can also include a dielectric region contacting the edge surfaces of the microelectronic element. The microelectronic unit can also include terminals exposed at a plane defined by the front surface and the dielectric region or at a plane defined by the rear surface and the dielectric region. The terminals can be electrically connected with the contacts of the microelectronic element. The microelectronic unit can also include traces extending along the dielectric region and electrically connecting the contacts with the terminals.

In an exemplary embodiment, a first subset of the terminals can be exposed at a front planar surface of the dielectric region, and a second subset of the terminals can be exposed at a rear planar surface of the dielectric region for interconnection with an external element. In one embodiment, the microelectronic unit can also include a plurality of conductive vias extending from the front surface through the carrier structure to the rear surface. In a particular embodiment, each via can have a first width at the rear surface of the carrier structure and a second width at an opposite end, the second width being different than the first width. In an exemplary embodiment, the dielectric region can extend between a wall of the opening and the microelectronic element.

In one embodiment, the microelectronic unit can also include a plurality of conductive vias extending from the front planar surface through the dielectric region to the rear planar surface. In a particular embodiment, the microelectronic unit can also include a plurality of conductive vias extending from the front planar surface through the dielectric region to the contacts of the microelectronic element. In an exemplary embodiment, the microelectronic unit can also include a plurality of conductive vias extending from the rear planar surface through the dielectric region to the contacts of the microelectronic element.

In accordance with an aspect of the invention, a method of fabricating a microelectronic unit includes the step of placing a microelectronic element having a top surface and a bottom surface remote from the top surface, and a plurality of contacts at the top surface into a recess of a carrier structure having a front surface and a rear surface remote from the front surface. The carrier structure can include at least one of semiconductor material or glass. The method can also include the step of electrically interconnecting the contacts with terminals of the carrier structure. The top or bottom surface of the microelectronic element can be placed adjacent an inner surface of the carrier structure within the recess.

The method of fabricating a microelectronic unit can also include the step of applying a dielectric region to the recess. The dielectric region can contact at least the top surface of the microelectronic element. The method can also include the step of planarizing the dielectric region to define a planar surface located coplanar with or above the front surface of the carrier structure.

In one embodiment, the method of fabricating a microelectronic unit can also include the step of plating traces on the dielectric region using a photolithographic patterning process. In a particular embodiment, the step of applying a dielectric region to the recess can include applying a layer over the entire inner surface of the recess.

In a particular embodiment, a method of fabricating a stacked assembly of microelectronic units can include the step of stacking a first microelectronic unit on top of a second microelectronic unit. The method can also include the step of joining the first microelectronic unit to the second microelectronic unit through a conductive bond material.

The step of planarizing the dielectric region can include grinding, polishing, or etching a portion of the bottom surface of the microelectronic element and the front surface of the carrier structure. In an exemplary embodiment, the bottom surface of the microelectronic element can be placed adjacent the inner surface of the carrier structure within the recess. The method can also include the step of grinding a portion of the bottom surface of the microelectronic element and the rear surface of the carrier structure until the bottom surface of the microelectronic element is exposed at the rear surface of the carrier structure. In an exemplary embodiment, the method can also include the step of forming a plurality of conductive vias extending from the front surface through the carrier structure to the rear surface.

In one embodiment, the step of forming the plurality of conductive vias can include forming a plurality of sockets extending from the front surface through the carrier structure to a location that is beneath the rear surface, and the step of grinding a portion of the rear surface of the carrier structure can include grinding the rear surface until the plurality of sockets are exposed at the rear surface thereby becoming the plurality of conductive vias. In a particular embodiment, the method can include the step forming a plurality of conductive vias extending from a major surface of the dielectric region through the carrier structure to the rear surface.

In one embodiment, the method can include the step of forming a plurality of conductive vias extending from the rear surface through the carrier structure to the front surface. In a particular embodiment, the step of forming the plurality of conductive vias can include forming a plurality of sockets extending from the rear surface through the carrier structure to a location that is beneath the front surface, and the step of planarizing the dielectric region can include grinding, polishing, or etching the front surface of the carrier structure until the plurality of sockets are exposed at the front surface thereby becoming the plurality of conductive vias.

In a particular embodiment, the steps of forming the recess, forming the plurality of conductive vias, forming the terminals, applying the dielectric region, and planarizing the dielectric region can be performed while the carrier structure remains attached to at least one other carrier structure at an edge thereof.

In one embodiment, a method of fabricating a stacked assembly of microelectronic units can include the step of stacking a first microelectronic unit on top of a second microelectronic unit. The method can also include the step of joining the first microelectronic unit to the second microelectronic unit. The steps of forming the plurality of conductive vias and joining the first microelectronic unit to the second microelectronic unit can include drilling holes extending through both the first and second microelectronic units after the stacking step, and plating the holes with a conductive material.

In a particular embodiment, the method of fabricating a microelectronic unit can also include the step of forming a plurality of conductive vias extending from the inner surface of the recess through the carrier structure towards the rear surface. In an exemplary embodiment, the steps of forming the recess, forming the plurality of conductive vias, forming the terminals, applying the dielectric region, and planarizing the dielectric region can be performed while the carrier structure remains attached to at least one other carrier structure at an edge thereof.

In an exemplary embodiment, a method of fabricating a stacked assembly of microelectronic units can include the step of stacking a first microelectronic unit on top of a second microelectronic unit. The method can also include the step of joining the first microelectronic unit to the second microelectronic unit through a conductive bond material.

In one embodiment, the method of fabricating a microelectronic unit can also include the step of joining the contacts of the microelectronic element to conductive pads located adjacent the inner surface of the recess. The step of forming a plurality of conductive vias can include forming the vias extending from the rear surface of the carrier structure to the conductive pads. In a particular embodiment, the method can also include the step of joining the microelectronic element to a dielectric layer coating the inner surface of the recess. The step of forming a plurality of conductive vias can include forming holes extending from the rear surface of the carrier structure to the contacts of the microelectronic element. The step of forming a plurality of conductive vias can be performed by electroplating the holes.

Further aspects of the invention provide systems which incorporate microelectronic structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

DETAILED DESCRIPTION

In the embodiments shown and described herein, microelectronic units can be planarized. Planarized microelectronic units can advantageously be incorporated in stacked assemblies. Reducing the number of different sizes of microelectronic units can also facilitate stacking of the microelectronic units.

Figure 1A:
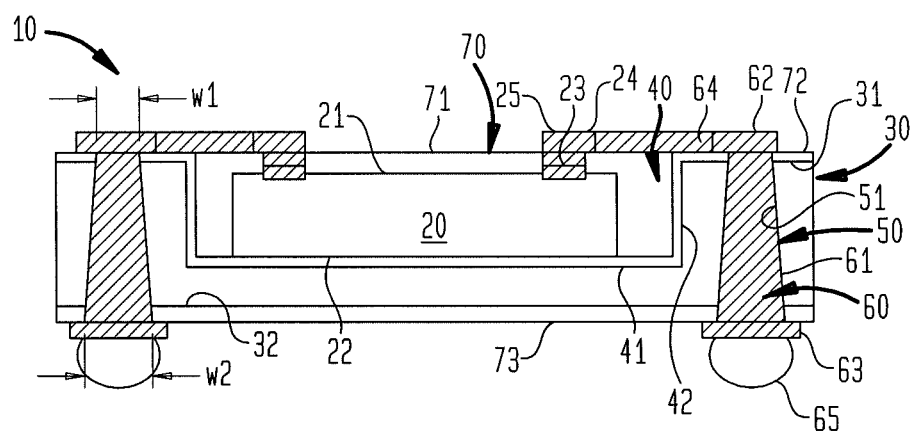
FIGS. 1A and 1B are a sectional view and a corresponding top-down plan view illustrating a packaged chip and chip carrier assembly in accordance with an embodiment of the invention.
Figure 1B:
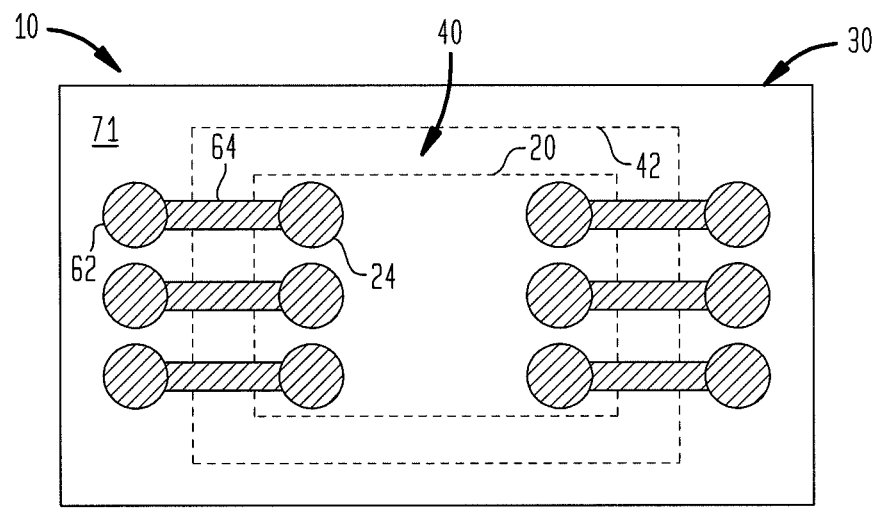

FIGS. 1A and 1B are a sectional view and a corresponding top-down plan view illustrating a packaged chip and chip carrier assembly in accordance with an embodiment of the invention. As illustrated in FIGS. 1A and 1B, a microelectronic unit 10 includes a microelectronic element 20 mounted to a carrier structure 30.

The microelectronic element 20 can include a semiconductor substrate, made for example from silicon, in which one or a plurality of semiconductor devices (e.g., transistors, diodes, etc.) is disposed in an active semiconductor region thereof located at and/or below the top surface 21. The thickness of the microelectronic element 20 between the top surface 21 and a bottom surface 22 that is remote from the front surface typically is less than 200 µm, and can be significantly smaller, for example, 130 µm, 70 µm or even smaller. The microelectronic element 20 includes a plurality of conductive contacts 23 located at the top surface thereof for electrical connection to other conductive elements.

While not specifically shown in FIGS. 1A and 1B, the semiconductor devices in the active semiconductor region typically are conductively connected to the conductive contacts 23. The semiconductor devices, thus, are accessible conductively through wiring incorporated within one or more dielectric layers of the microelectronic element 20. In some embodiments, the contact pads at the front surface of the microelectronic element may not be directly exposed at the front surface of the microelectronic element. Instead, the contact pads may be electrically connected to traces extending to terminals that are exposed.

As used in this disclosure, a statement that an electrically conductive element is "exposed at" a surface of a dielectric element indicates that the electrically conductive element is available for contact with a theoretical point moving in a direction perpendicular to the surface of the dielectric element toward the surface of the dielectric element from outside the dielectric element. Thus, a terminal or other conductive element which is exposed at a surface of a dielectric element may project from such surface; may be flush with such surface; or may be recessed relative to such surface and exposed through a hole or depression in the dielectric.

While essentially any technique usable for forming conductive elements can be used to form the conductive elements described herein, non-lithographic techniques as discussed in greater detail in the co-pending application Ser. No. 12842,669 entitled Non-Lithographic Formation of Three-Dimensional Conductive Elements, filed on even date herewith, can be employed. Such non-lithographic techniques can include, for example, selectively treating a surface with a laser or with mechanical processes such as milling or sandblasting so as to treat those portions of the surface along the path where the conductive element is to be formed differently than other portions of the surface. For example, a laser or mechanical process may be used to ablate or remove a material such as a sacrificial layer from the surface only along a particular path and thus form a groove extending along the path. A material such as a catalyst can then be deposited in the groove, and one or more metallic layers can be deposited in the groove.

The carrier structure 30 defines a recess 40 extending from a front surface 31 thereof partially through the carrier structure towards a rear surface 32. The carrier structure 30 can be made from a semiconductor, for example, silicon. In one example, the carrier structure 30 can be made from a metal such as copper, which may allow the carrier structure to function as a heat spreader for the microelectronic element 20. In an exemplary embodiment, the carrier structure 30 can include an outer metal finish layer, such that the carrier structure is adapted to function as a heat spreader.

The recess 40 includes an inner surface 41 located at the bottom of the recess that is farthest away from the front surface 31 of the carrier structure 30. The recess 40 includes a lateral edge surface 42 (i.e., a sidewall of the recess 40) that extends between the inner surface 41 of the recess and the front surface 31 of the carrier structure 30. The recess 40 may extend more than half-way from the front surface 31 towards the rear surface 32, such that a height of the recess 40 in a direction perpendicular to the front surface 31 is greater than a height of the remaining portion of the carrier structure 30 extending between the inner surface 41 and the rear surface 32.

The recess 40 can have any top-view shape, including for example, a rectangular channel, as shown in FIG. 1B. As shown in FIGS. 1A and 1B, the recess 40 includes a single microelectronic element 20. In other embodiments, the recess can include any number of microelectronic elements 20. In one example, such as in the embodiment shown in FIG. 11A, the recess can include a plurality of microelectronic elements. In some examples, the recess 40 can have any three-dimensional shape, including for example, a cylinder, a cube, or a prism, among others.

Figure 8A:
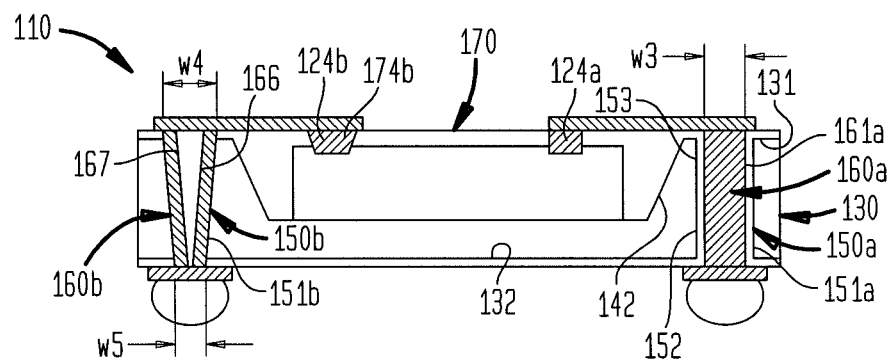
FIG. 8A is a sectional view illustrating a packaged chip in accordance with another embodiment.

As shown in FIG. 1A, the lateral edge surface 42 extends from the front surface 31 of the carrier structure 30 through the carrier structure at an angle that is normal to a horizontal plane defined by the front surface 31. In other embodiments, the lateral edge surface 42 can extend from the front surface 31 at any angle to the front surface 31, including, for example, an angle between about 60 and about 100 degrees. The lateral edge surface 42 can have a constant slope or a varying slope. For example, the angle or slope of the lateral edge surface 42 relative to the horizontal plane defined by the front surface 31 can decrease as the lateral edge surface penetrates further towards the inner surface 41. An exemplary embodiment having a lateral edge surface that extends from the front surface of the carrier structure at a non-normal angle is shown in FIG. 8A.

The carrier structure 30 also defines a plurality of holes 50 extending from the front surface 31 thereof through the carrier structure to the rear surface 32, and a plurality of conductive vias 60, each conductive via extending through a respective hole 50. In the embodiment described with respect to FIGS. 1A and 1B, there are six holes 50 and respective conductive vias 60. In other examples, there can be any number of holes and conductive vias extending through the carrier structure. For example, in the embodiment shown in FIG. 11A, there are eighteen holes extending through the carrier structure.

The holes 50 can be arranged in any geometric configuration within the carrier structure 30. For example, the holes 50 can arranged along a single common axis, or the holes 50 can be arranged in two parallel rows, as shown in FIGS. 1B and 11. In other examples (not shown), the holes 50 can be arranged in a cluster, grid, ring, or any other shape.

Each hole 50 includes an inner surface 51 that extends through the carrier structure 30. As shown in FIG. 1A, the hole 50 has a width W1 at the front surface 31 and a width W2 at the rear surface 32 which is greater than W1 such that the hole is tapered in a direction from the rear surface towards the front surface. In other examples, as shown for example in FIG. 8A, one or more holes can have a constant width, and one or more holes can be tapered in a direction from the front surface towards the rear surface.

The inner surface 51 of each hole 50 can have a constant slope or a varying slope. For example, the angle or slope of the inner surface 51 relative to the horizontal plane defined by the front surface 31 of the carrier structure 30 can decrease in magnitude (become less positive or less negative) as the inner surface 51 penetrates further from the front surface 31 to the rear surface 32 of the carrier structure.

Each hole 50 can have any top-view shape, including for example, a round shape, as shown in FIG. 1B (in FIG. 1B, each hole 50 has a frusto-conical three-dimensional shape). In some embodiments, each hole 50 can have a square, rectangular, oval, or any other top-view shape. In some examples, each hole 50 can have any three-dimensional shape, including for example, a cylinder, a cube, or a prism, among others.

Each conductive via 60 extends within a respective hole 50 and defines an outer surface 61 that extends along the height of the conductive via between the front surface 31 and the rear surface 32 of the carrier structure 30. Each conductive via 60 can be made from a metal or an electrically conductive compound of a metal, including for example, copper or gold.

Each conductive via 60 is electrically connected to a front conductive contact 62 at the front surface 31 and a rear conductive contact 63 at the rear surface 32. Each front conductive contact 62 and rear conductive contact 63 (or any of the other conductive contacts disclosed herein), if exposed at an external surface of the microelectronic unit 10 (e.g., the front surface 31, the rear surface 32, a major surface 71 of a dielectric region 70, or a dielectric layer 72 or 73 overlying the respective surfaces 31 or 32), is suitable to be used as a terminal for electrical connection to an external element.

As shown, the conductive via 60 is also in registration with the conductive contacts 62 and 63 (i.e., the conductive via 60 and the conductive contacts 62 and 63 share a common central axis). In other examples, the conductive via may have a different central axis than either or both of the front and rear conductive contacts. Each conductive contact 62 and 63 can be made from any electrically conductive metal, including for example, copper or gold. As shown, the conductive contacts 62 and 63 have a round top-view shape. In other examples, the conductive contacts 62 and 63 and any of the conductive contacts disclosed herein can have any top-view shape, including an oval, triangle, square, rectangle, or any other shape.

Each conductive via 60 is also electrically connected to one or more conductive contacts 23 of the microelectronic element 20. As shown in FIGS. 1A and 1B, each conductive via 60 is electrically connected to a respective conductive contact 23 through a terminal 24, a conductive trace 64 extending along the front surface 31 of the carrier structure 30, and the front conductive contact 62. In other examples, each conductive via 60 can be electrically connected to one or more conductive contacts 23 in any other configuration.

The combination of one or more of the terminal 24, the conductive contact 62, and the conductive trace 64 can also be considered to be an "extended bond pad" that is suitable for connection to an external element (not shown).

As shown, each conductive via 60 is electrically connected to a respective conductive bond material 65 exposed at a bottom surface of the rear conductive contact 63, for electrical interconnection to an external element (not shown). In other examples, the conductive bond material 65 can be replaced with any other electrical interconnection element (e.g., conductive nanoparticles), or the conductive bond material 65 can be omitted (e.g., when diffusion bonding is used).

The conductive via 60, the conductive contacts 62 and 63, the traces 64, and the terminals 24 are all electrically insulated from the microelectronic element 20 by a dielectric region or layer. For example, the traces 64 are insulted from the carrier structure 30 by a dielectric region 70 having a major surface 71, the front conductive contacts 62 are insulated from the front surface 31 by a dielectric layer 72, and the rear conductive contacts 63 are insulated from the rear surface 32 by a dielectric layer 73. Each conductive via 60 is also insulated from the hole 50 by a dielectric layer extending along the inner surface 51 thereof (not shown).

As shown in FIG. 1A, the conductive via 60 can fill all of the volume within the hole 50 inside of a dielectric layer that electrically insulates the carrier structure 30 from the conductive via 60. In other words, the outer surface 61 of the conductive via 60 conforms to a contour of the inner surface 51 of the respective hole 50.

In other examples, the conductive via 60 may not fill all of the volume inside of a dielectric layer that insulates the hole 50. In one example, the outer surface 61 of the conductive via 60 may not conform to a contour of the inner surface 51 of the respective hole 50. In such an example, a dielectric region can fill the hole 50, an aperture can be drilled through the dielectric region, and the aperture can be plated to form the conductive via. FIG. 8A shows such an example embodiment having a conductive via that has an outer surface that does not conform to an inner surface of the hole.

The conductive via 60 can be formed either solid or hollow depending upon the process conditions. For example, the conductive via 60 can be formed by a conformal plating of the dielectric layer that insulates the hole 50, such that there is an internal aperture extending through the center of the conductive via. This internal aperture can be filled with a dielectric material, or it can be left open. FIG. 8A shows such an example embodiment including a conductive via having an internal aperture.

As shown, each conductive via 60 has a frusto-conical shape. In other examples, the conductive via 60 can have any other shape, including, for example, a cylindrical shape (as shown in FIG. 8A), or a combination of cylindrical and frusto-conical shapes at different heights along the conductive via.

The dielectric region 70 fills the portion of the recess 40 that is not occupied by the microelectronic element 20, and the dielectric region 70 can provide good dielectric isolation with respect to the microelectronic element 20. The dielectric region 70 can be compliant, having a sufficiently low modulus of elasticity and sufficient thickness such that the product of the modulus and the thickness provide compliancy. Specifically, such a compliant dielectric region 70 can allow the conductive elements attached thereto to flex or move somewhat relative to the microelectronic element 20 and/or the carrier structure 30 when an external load is applied to the conductive elements. In that way, the bond between the conductive elements of the microelectronic unit 10 and terminals of an external element such as a circuit panel (not shown) can better withstand thermal strain due to mismatch of the coefficient of thermal expansion ("CTE") between the microelectronic unit 10 and the circuit panel.

In the embodiments shown, the major surface 71 of the dielectric region 70 extends above a plane defined by the front surface 31 of the carrier structure 30. In other examples, the major surface 71 can extend to be approximately in the same plane that is defined by the front surface 31 of the carrier structure 30.

The dielectric layers 72 and 73 can include an inorganic or organic dielectric material or both. The dielectric layers 72 and 73 may include an electrodeposited conformal coating or other dielectric material, for example, a photoimageable polymeric material, for example, a solder mask material.

Each terminal 24 is exposed at the major surface 71 of the dielectric region 70 for interconnection to an external element. Each terminal 24 can be aligned with the recess 40 and can be disposed wholly or partly within an area of the carrier structure 30 defined by the recess 40. As seen in FIG. 1A, the terminal 24 is wholly disposed within an area defined by the recess 40. In other examples, the terminal 24 can be located outside the area defined by the recess 40 (e.g., see FIG. 9A). As shown, a plane defined by a top surface 25 of the terminal 24 is substantially parallel to the plane defined by the front surface 31 of the carrier structure 30. In addition to or instead of electrically interconnecting the terminal 24 to an external element, the front conductive contact 62 can serve as a terminal and can be electrically interconnected to an external element.

As shown, the top surface 25 of the terminal 24 is located above the plane defined by the front surface 31 of the carrier structure 30. In other embodiments, the top surface 25 of the terminal 24 can be located at or below the plane defined by the front surface 31 (see FIGS. 6A-6C for various configurations of the top surface of the terminal compared to the planes defined by the front surface of the carrier structure and the major surface of the dielectric region).

As shown in FIG. 1B, the terminals 24 and the front conductive contacts 62 have the shape of a conductive bond pad. In other embodiments, the terminals 24 and the conductive contacts 62 can be any other type of conductive contact, including for example, a conductive post.

Figure 2:
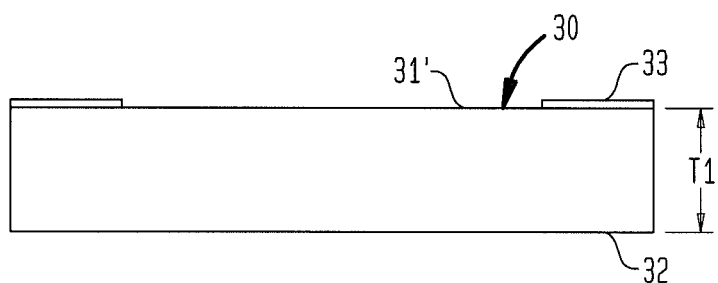
FIG. 2 is a sectional view illustrating a stage in a method of fabrication in accordance with an embodiment of the invention.

A method of fabricating the microelectronic unit 10 (FIGS. 1A and 1B) will now be described, with reference to FIGS. 2 through 7. Referring to FIG. 2, the carrier structure 30 includes an initial front surface 31'. At this stage of fabrication, the initial front surface 31' can be spaced uniformly from the rear surface 32 of the carrier structure 30 by an initial thickness T1 thereof. A mask layer 33 can be formed where it is desired to preserve remaining portions of the initial front surface 31' of the carrier structure 30.

Figure 3A:
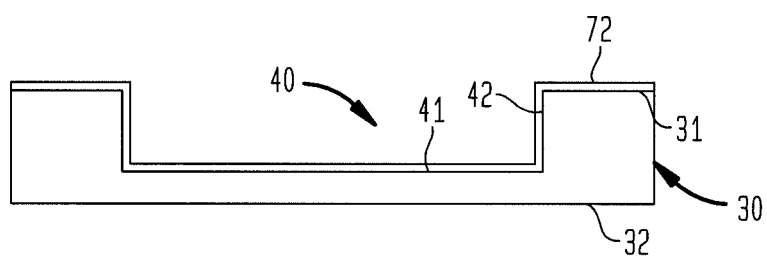
FIGS. 3A and 3B are a sectional view and a corresponding top-down plan view illustrating a stage of fabrication in accordance with an embodiment of the invention.
Figure 3B:
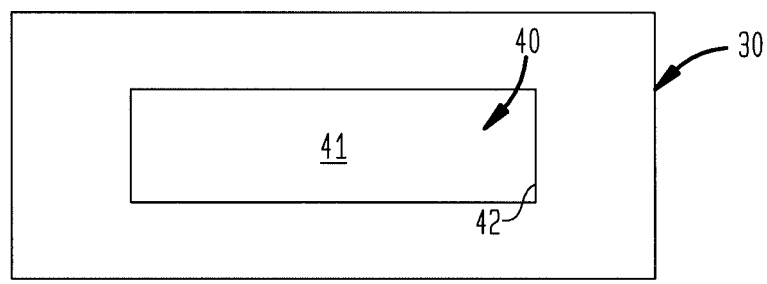

Referring to FIGS. 3A and 3B, the recess 40 can be formed, for example, by selectively etching the carrier structure 30, after forming the mask layer 33. For example, a photoimageable layer, e.g., a photoresist layer, can be deposited and patterned to cover only portions of the initial front surface 31', after which a timed etch process can be conducted to form the recess 40. As shown in FIG. 3, the recess 40 extends downwardly from the front surface 31 towards the rear surface 32 of the carrier structure 30.

The recess 40 has an inner surface 41 which is flat and typically equidistant from the rear surface 32. The lateral edge surface 42 of the recess, extending downwardly from the front surface 31 towards the inner surface 41, may be sloped, i.e., may extend at angles other a normal angle (right angle) to the front surface 31, as shown in FIG. 8A.

In the embodiments shown and described herein, some or all of the openings in the carrier structure 30 (e.g., the recess 40) can be formed by directing a jet of fine abrasive particles onto a surface of the carrier structure. The fine abrasive particles remove material exposed at the surface. As used herein, sandblasting means this process, whether or not the abrasive particles include sand or silicon dioxide particles, a main component of sand. Use of sandblasting to form some of the openings in a carrier structure can reduce the time and cost of producing microelectronic units.

Wet etching processes, e.g., isotropic etching processes and sawing using a tapered blade, among others, can be used to form a recess having a sloped lateral edge surface. Sandblasting, laser dicing, mechanical milling, among others, can also be used to form a recess having a sloped lateral edge surface.

Alternatively, instead of being sloped, the lateral edge surface 42 of the recess may extend in a vertical or substantially vertical direction downwardly from the front surface 31 substantially at right angles to the front surface 31. Anisotropic etching processes, laser dicing, laser drilling, mechanical removal processes, e.g., sandblasting, sawing, milling, ultrasonic machining, among others, can be used to form a recess 40 having an essentially vertical lateral edge surface 42.

After forming the recess 40 in the carrier structure 30, a dielectric layer 72 is deposited onto the front surface 31 of the carrier structure and onto the inner surface 41 and lateral edge surface 42 of the recess, to electrically isolate the carrier structure 30 from the microelectronic element and the conductive elements that will be added later.

Various methods can be used to form the dielectric layer 72. In one example, a flowable dielectric material can be applied to the front surface 31 of the carrier structure 30 and onto the inner surface 41 and lateral edge surface 42 of the recess, and the flowable material is then more evenly distributed during a "spin-coating" operation, followed by a drying cycle which may include heating. In another example, a thermoplastic film of dielectric material can be applied to the front surface 31 of the carrier structure 30 after which the assembly is heated, or is heated in a vacuum environment, i.e., placed in an environment under lower than ambient pressure. This then causes the film to flow downward onto the lateral edge surface 42 and the inner surface 41 of the recess 40. In another example, vapor deposition can be used to form the dielectric layer 72.

In still another example, the carrier structure 30 can be immersed in a dielectric deposition bath to form a conformal dielectric coating or dielectric layer 72. As used herein, a "conformal coating" is a coating of a particular material that conforms to a contour of the surface being coated, such as when the dielectric layer 72 conforms to a contour of the recess 40. An electrochemical deposition method can be used to form the conformal dielectric layer 72, including for example, electrophoretic deposition or electrolytic deposition.

In one example, an electrophoretic deposition technique can be used to form the conformal dielectric coating, such that the conformal dielectric coating is only deposited onto exposed conductive and semiconductive surfaces of the assembly. During deposition, the carrier structure 30 is held at a desired electric potential and an electrode is immersed into the bath to hold the bath at a different desired potential. The assembly is then held in the bath under appropriate conditions for a sufficient time to form an electrodeposited conformal dielectric layer 72 on exposed surfaces of the carrier structure 30 which are conductive or semiconductive, including but not limited to along the front surface 31, the rear surface 32, the inner surface 41, and the lateral edge surface 42. Electrophoretic deposition occurs so long as a sufficiently strong electric field is maintained between the surface to be coated thereby and the bath. As the electrophoretically deposited coating is self-limiting in that after it reaches a certain thickness governed by parameters, e.g., voltage, concentration, etc. of its deposition, deposition stops.

Electrophoretic deposition forms a continuous and uniformly thick conformal coating on conductive and/or semiconductive exterior surfaces of the assembly. In addition, the electrophoretic coating can be deposited so that it does not form on any already-deposited dielectric layer, e.g., such as the dielectric layer 73 shown in FIG. 1A, due to its dielectric (nonconductive) property. Stated another way, a property of electrophoretic deposition is that is does not form on a layer of dielectric material overlying a conductor provided that the layer of dielectric material has sufficient thickness, given its dielectric properties. Typically, electrophoretic deposition will not occur on dielectric layers having thicknesses greater than about 10 microns to a few tens of microns. The conformal dielectric layer 72 can be formed from a cathodic epoxy deposition precursor. Alternatively, a polyurethane or acrylic deposition precursor could be used. A variety of electrophoretic coating precursor compositions and sources of supply are listed in Table 1 below.

TABLE 1

| ECOAT NAME | POWERCRON 645 | POWERCRON 648 | CATHOGUARD 325 |
|---|---|---|---|
| MANUFACTURERS | | | |
| MFG | PPG | PPG | BASF |
| TYPE | CATHODIC | CATHODIC | CATHODIC |
| POLYMER BASE | EPOXY | EPOXY | EPOXY |
| LOCATION | Pittsburgh, PA | Pittsburgh, PA | Southfield, MI |
| APPLICATION DATA | | | |
| Pb/Pf-free | Pb-free | Pb or Pf-free | Pb-free |
| HAPs, g/L | | 60-84 | COMPLIANT |
| VOC, g/L (MINUS WATER) | | 60-84 | <95 |
| CURE | 20 min/175 C. | 20 min/175 C. | |
| FILM PROPERTIES | | | |
| COLOR | Black | Black | Black |
| THICKNESS, μm | 10-35 | 10-38 | 13-36 |
| PENCIL HARDNESS | | 2H+ | 4H |
| BATH CHARACTERISTICS | | | |
| SOLIDS, % wt. | 20 (18-22) | 20 (19-21) | 17.0-21.0 |
| pH (25 C) | 5.9 (5.8-6.2) | 5.8 (5.6-5.9) | 5.4-6.0 |
| CONDUCTIVITY (25 C) μS | 1000-1500 | 1200-1500 | 1000-1700 |
| P/B RATIO | 0.12-0.14 | 0.12-0.16 | 0.15-0.20 |
| OPERATION TEMP., C. | 30-34 | 34 | 29-35 |
| TIME, sec | 120-180 | 60-180 | 120+ |
| ANODE | SS316 | SS316 | SS316 |
| VOLTS | | 200-400 | >100 |

| ECOAT NAME | ELECTROLAC | LECTRASEAL DV494 | LECTROBASE 101 |
|---|---|---|---|
| MANUFACTURERS | | | |
| MFG | MACDERMID | LVH COATINGS | LVH COATINGS |
| TYPE | CATHODIC | ANODIC | CATHODIC |
| POLYMER BASE | POLYURETHANE | URETHANE | URETHANE |
| LOCATION | Waterbury, CT | Birmingham, UK | Birmingham, UK |
| APPLICATION DATA | | | |
| Pb/Pf-free | | Pb-free | Pb-free |
| HAPs, g/L | | | |
| VOC, g/L (MINUS WATER) | | | |
| CURE | 20 min/149 C. | 20 min/175 C. | 20 min/175 C. |
| FILM PROPERTIES | | | |
| COLOR | Clear (+dyed) | Black | Black |
| THICKNESS, μm | | 10-35 | 10-35 |
| PENCIL HARDNESS | 4H | | |
| BATH CHARACTERISTICS | | | |
| SOLIDS, % wt. | 7.0 (6.5-8.0) | 10-12 | 9-11 |
| pH (25 C) | 5.5-5.9 | 7-9 | 4.3 |
| CONDUCTIVITY (25 C) μS | 450-600 | 500-800 | 400-800 |
| P/B RATIO | | | |
| OPERATION TEMP., C. | 27-32 | 23-28 | 23-28 |

TABLE 1-continued

| TIME, sec | | | 60-120 |
|---|---|---|---|
| ANODE | SS316 | 316SS | 316SS |
| VOLTS | 40, max | | 50-150 |

In another example, the dielectric layer can be formed electrolytically. This process is similar to electrophoretic deposition, except that the thickness of the deposited layer is not limited by proximity to the conductive or semiconductive surface from which it is formed. In this way, an electrolytically deposited dielectric layer can be formed to a thickness that is selected based on requirements, and processing time is a factor in the thickness achieved.

Figure 3C:
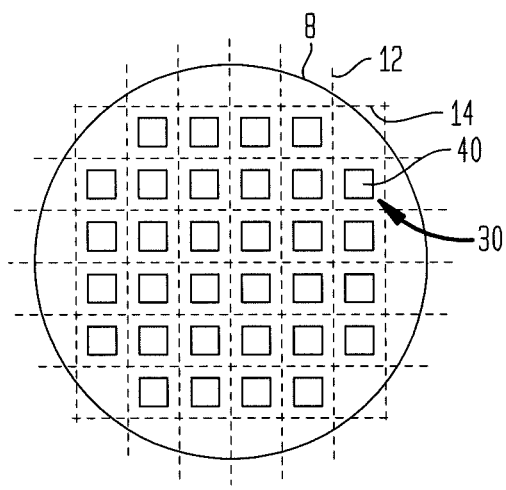
FIG. 3C is a plan view illustrating a stage of fabrication in accordance with an embodiment of the invention.

Referring now to FIG. 3C, carrier structures 30 (and the microelectronic units 10 that they will form) can be processed simultaneously by wafer-level processing, i.e., by processing performed simultaneously to a plurality of carrier structures 30 while they remain joined together as a portion of a wafer or as an entire semiconductor or metal wafer. After reaching a stage of fabrication illustrated in FIGS. 1A and 1B for example, the wafer can be severed along dicing lanes 12 and 14 into individual packaged microelectronic units.

As illustrated in FIG. 3A, a wafer 8 or portion of a wafer 8 contains a plurality of carrier structures 30, each carrier structure 30 having a recess 40. Dicing lane 12 indicates a location of a dicing lane at a boundary between individual carrier structures 30. Dicing lanes 12 of the wafer 8 need not be very wide. The locations of the recesses 40 of the microelectronic units can be spaced apart from the dicing lanes. A representative width of the dicing lane 12 is approximately 40 μm (microns).

A variety of exemplary processes for severing wafers into individual units are described in the herein incorporated commonly owned U.S. Provisional Application Nos. 60/761,171 and 60/775,086, any of which can be used to sever the wafers to form individual microelectronic units 10 as shown in FIGS. 1A and 1B.

Figure 4:
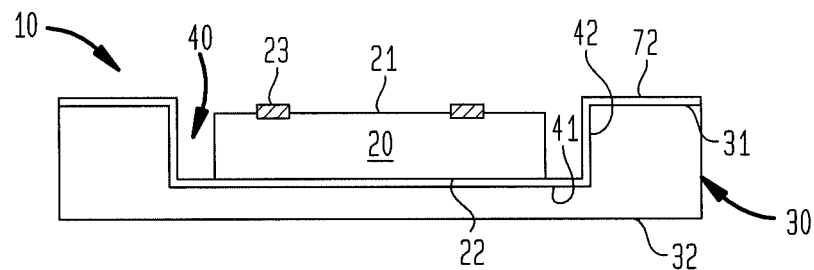
FIG. 4 is a sectional view illustrating a stage in a method of fabrication in accordance with an embodiment of the invention.

Referring now to FIG. 4, the microelectronic element 20 is mounted into the recess 40 of the carrier structure 30, such that the bottom surface 22 of the microelectronic element is adjacent the inner surface 41 of the recess. The top surface 21 of the microelectronic element 20 includes the conductive contacts 23 that face upward, away from the inner surface 41 of the recess 40. The microelectronic element 20 can be mounted into the recess 40 with an adhesive, an adhesive dielectric, or any other suitable mounting mechanism.

Figure 5:
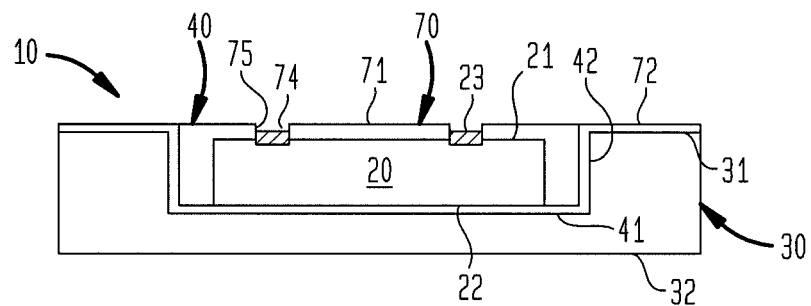
FIG. 5 is a sectional view illustrating a stage in a method of fabrication in accordance with an embodiment of the invention.

Referring now to FIG. 5, a dielectric region 70 is formed inside the recess 40. The dielectric region 70 can include an inorganic material, a polymeric material, or both. Optionally, the dielectric region 70 can be formed such that the exposed major surface 71 of the region is co-planar or substantially co-planar with the front surface 31 of the carrier structure 30 or the exposed surface of the dielectric layer 72. For example, a self-planarizing dielectric material can be deposited in the recess 40, e.g., by a dispensing or stenciling process. In another example, a grinding, lapping, or polishing process can be applied to the front surface 31 of the carrier structure 30 or the exposed surface of the dielectric layer 72 after forming the dielectric region 70 to planarize the major surface 71 of the dielectric region 70 to the front surface 31 or the exposed major surface 71 of the dielectric layer 72. In a particular embodiment, the dielectric region 70 can be compliant, having a sufficiently low modulus of elasticity and sufficient thickness such that the product of the modulus and the thickness provide compliancy.

The major surface 71 of the dielectric region 70 can be planarized by other methods. In one embodiment, a grinding process can be used, for example, to planarize the major surface 71 with the front surface 31 of the carrier structure 30. The grinding process can remove both the dielectric material and the silicon material. The major surface 71 and the front surface 31 can also be planarized by lapping or polishing.

In a particular example, chemical mechanical polishing ("CMP") can be used to planarize the major surface 71 of the dielectric region 70 and/or the front surface 31 of the carrier structure 30. An exemplary CMP process can include sanding the major surface 71 and/or the front surface 31 with an abrasive pad, using a lubricant. An exemplary CMP process can include using an abrasive slurry, including, for example, a micro-silica paste, to planarize the major surface 71 and/or the front surface 31.

Then, apertures 74 are formed, extending through the dielectric region 70 between the conductive contacts 23 and the major surface 71 of the dielectric region 70. The apertures 74 can be formed, for example, via laser ablation, or any other appropriate method. As shown in FIG. 5, the apertures 74 have a cylindrical shape. In other examples, the apertures can have a frusto-conical shape (see FIG. 8A) or other shapes, including for example, a combination of a cylindrical and a frusto-conical shape at different distances from the front surface 31 of the carrier structure 30.

Figure 6A:
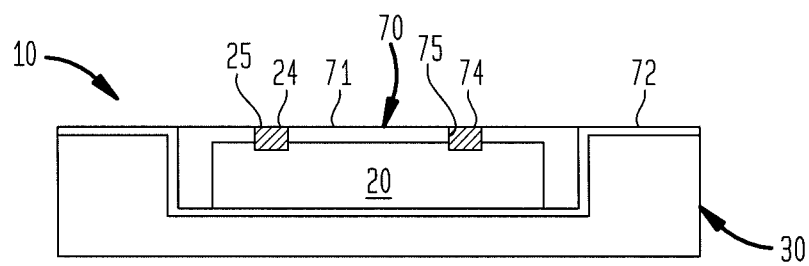
FIG. 6A is a sectional view illustrating a stage in a method of fabrication in accordance with an embodiment of the invention.

Referring now to FIG. 6A, the terminals 24 are formed within the apertures 74. The terminals are electrically connected to respective conductive contacts 23 and insulated from the microelectronic element 20 by the dielectric region 70. To form the terminals 24, an exemplary method involves electroless deposition. This step can be performed by blanket deposition onto interior surfaces 75 of the respective apertures 74, for example, such that the shape of each terminal 24 conforms to a contour of the respective interior surface 75. As shown in FIG. 6A, the terminals 24 are solid. In other embodiments (not shown), each terminal can include an internal space that is filled with a dielectric material.

In an exemplary embodiment, the terminals 24 can be formed at a location remote from the conductive contacts 23 (see FIG. 9A), and traces can be deposited onto the major surface 71 of the dielectric region 70 to electrically connect the conductive contacts 23 with the terminals 24.

As shown in FIG. 6A, the terminals 24 extend such that the top surface 25 of the terminal 24 is coplanar with the major surface 71 of the dielectric region 70. The terminals 24 are suitable for electrical connection with an external element, for example, using wire bonds or conductive masses such as solder balls.

Figure 6B:
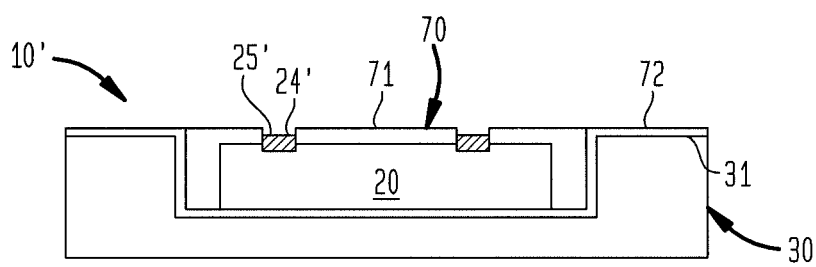
FIGS. 6B and 6C are sectional views illustrating a stage in a method of fabrication in accordance with alternate embodiments of the invention.

In one example, such as the example shown in FIG. 6B, terminals 24' can be exposed at the major surface 71 of the dielectric region 70 or exposed at the front surface 31 of the carrier structure 30, while the top surface 25' of the terminals 24' do not extend to the major surface 71 of the dielectric region 70. The terminals 24' are suitable for electrical connection with an external element, for example, using wire bonds or conductive masses such as solder balls.

Figure 6C:
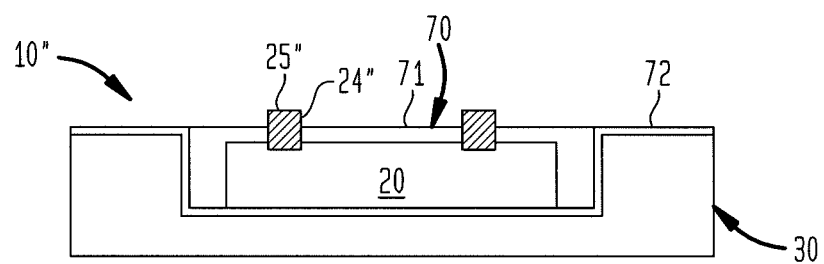

In a particular example, such as the example shown in FIG. 6C, the top surface 25" of each terminal 24" can extend above the major surface 71 of the dielectric region 70 or extend above the front surface 31 of the carrier structure 30. The terminals 24" are suitable for electrical connection with an external element, for example, using wire bonds or conductive masses such as solder balls.

Figure 10:
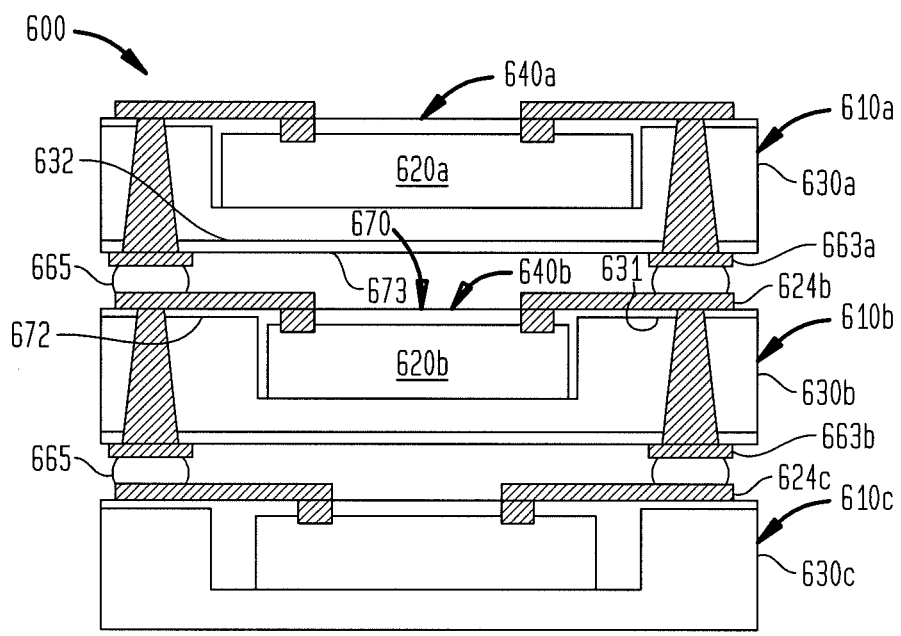
FIG. 10 is a sectional view illustrating a stacked assembly including a plurality of packaged chips in accordance with another embodiment.

In some embodiments, the example microelectronic units 10, 10', or 10" shown respectively in FIGS. 6A, 6B, and 6C may not require formation of conductive vias. For example, as shown in FIG. 10, the microelectronic unit at the bottom position of the stacked microelectronic assembly may not need to have conductive vias extending through to the rear surface if no additional microelectronic units need to be mounted underneath. The microelectronic unit 10 shown in FIG. 6A can be incorporated into the stacked assembly shown in FIG. 10 by electrically connecting the microelectronic unit 10 to another microelectronic unit through the terminals 24, for example, using wire bonds or conductive masses such as solder balls.

Figure 7:
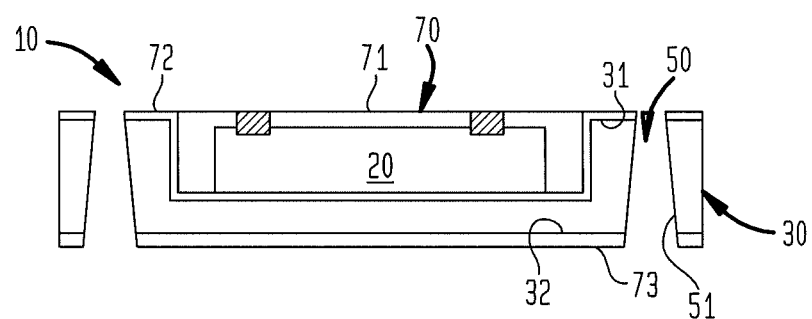
FIG. 7 is a sectional view illustrating a stage in a method of fabrication in accordance with an embodiment of the invention.

Referring now to FIG. 7, the holes 50 can be formed in the carrier structure 30, extending from the front surface 31 to the rear surface 32. A photoimageable layer such as a photoresist or a dielectric layer is deposited onto the front surface 31 and/or the rear surface 32 of the carrier structure 30 and patterned to form mask openings. The mask openings in the photoimageable layer or the dielectric layer are located at the desired locations for forming the holes 50 extending between the front surface 31 and the rear surface 32 of the carrier structure 30.

Thereafter, an etch process can be applied to the portions of the front surface 31 and/or the rear surface 32 exposed within the mask openings so as to remove the semiconductor or metal material underlying the mask openings. As a result, holes 50 are formed that extend between the front surface 31 and the rear surface 32 of the carrier structure 30.

The etch process can be conducted in a manner that selectively etches the semiconductor material, e.g., silicon, but preserves oxide material. By etching the semiconductor material in a selective manner that preserves the dielectric, over-etching can be performed as needed to etch through the thickness of the semiconductor material in all locations of the carrier structure 30 while maintaining a sufficient process window across the carrier structure 30. When a selective etch process is used, the dielectric layer, e.g., oxide layer (for example, the dielectric layer 73), remains in place after forming the holes 50. Alternatively, sandblasting, laser drilling, or mechanical milling can be used to form the holes 50.

Then, referring back to FIG. 1A, conductive vias 60 are formed within the holes 50. Each conductive via 60 is insulated from the inner surface 51 of the respective hole 50 by a dielectric layer or region (not shown, but deposited in a manner similar to that used to deposit the dielectric layer and/or region described above).

To form the conductive vias 60, an exemplary method involves depositing a metal layer by one or more of sputtering a primary metal layer onto exposed surfaces of the assembly, plating, or mechanical deposition. Mechanical deposition can involve the directing a stream of heated metal particles at high speed onto the surface to be coated. This step can be performed by blanket deposition onto the inner surface 51 of the hole 50. In one embodiment, the primary metal layer includes or consists essentially of aluminum. In another particular embodiment, the primary metal layer includes or consists essentially of copper. In yet another embodiment, the primary metal layer includes or consists essentially of titanium. One or more other exemplary metals can be used in a process to form the conductive vias 60.

In particular examples, a stack including a plurality of metal layers can be formed on the inner surface 51. For example, such stacked metal layers can include a layer of titanium followed by a layer of copper overlying the titanium (Ti—Cu), a layer of nickel followed by a layer of copper overlying the nickel layer (Ni—Cu), a stack of nickel-titanium-copper (Ni—Ti—Cu) provided in similar manner, or a stack of nickel-vanadium (Ni—V), for example.

Then, the traces 64 and conductive contacts 62 and 63 are formed to electrically connect the terminals 24 to the conductive vias 60. In some embodiments, the conductive contacts 62 and 63 and the traces 64 can be formed with the conductive vias 60 during a single electroless deposition step. In other embodiments, the conductive vias 60 and the other conductive elements 62, 63, and 64 can be formed by separate electroless deposition steps.

In one embodiment, the primary metal layer that comprises the conductive contacts 62 and 63 and the traces 64 includes or consists essentially of aluminum. In another particular embodiment, the primary metal layer includes or consists essentially of copper. In yet another embodiment, the primary metal layer includes titanium. One or more other exemplary metals can be used in a process to form the conductive contacts 62 and 63 and the traces 64.

Finally, if a wafer-level process was used to form the microelectronic units 10, the microelectronic units 10 can be severed from each other along dicing lanes by sawing or other dicing method to form individual microelectronic units 10.

FIG. 8A illustrates a microelectronic unit in accordance with another embodiment of the invention. The microelectronic unit 110 is similar to the microelectronic unit 10 described above and shown in FIG. 1A, but the microelectronic unit 110 differs in the shape and configuration of the lateral edges of the recess, the terminals, the holes, and the conductive vias that extend through the holes.

Rather than having a lateral edge surface of the recess that extends from the front surface of the carrier structure at an angle that is normal to the front surface (see FIG. 1A), the microelectronic unit 110 includes a lateral edge surface 142 that extends from the front surface 131 of the carrier structure 130 at a non-normal angle. In some examples, the non-normal angle of the lateral edge surface 142 can be between 60 and 100 degrees from horizontal.

The microelectronic unit 110 includes an inner surface 151a of a hole 150a extending between the front surface 131 and the rear surface 132 of the carrier structure 130. The hole 150a has a width W3 at the front surface 131 and the rear surface 132 such that the hole has a substantially constant width in a direction from the front surface towards the rear surface. Such a hole 150a can be formed from either the front surface 131 or the rear surface 132, using a process such as reactive ion etching or sandblasting.

The microelectronic unit 110 also includes an inner surface 151b of a hole 150b extending between the front surface 131 and the rear surface 132 of the carrier structure 130. The hole 150b has a width W4 at the front surface 131 and a width W5 at the rear surface 132 which is less than W4 such that the hole is tapered in a direction from the front surface towards the rear surface. Such a hole 150b can be formed from the front surface 131, using a process such as wet etching or sandblasting.

The microelectronic unit 110 includes a conductive via 160a that does not fill all of the volume inside of a dielectric region 152 that insulates the hole 150a. The outer surface 161a of the conductive via 160a does not conform to a contour of the inner surface 151a of the respective hole 150a. The dielectric region 152 fills the hole 150a, an aperture 153 extends through the dielectric region, and the aperture 153 can be plated to form the conductive via 160a. The conductive via 160*a* defines a cylindrical shape, rather than a frusto-conical shape (such as that defined by the conductive via 60 shown in FIG. 1A).

The microelectronic unit 110 includes a hollow conductive via 160*b*, rather than the solid conductive via 160 shown in FIG. 1A. For example, the conductive via 160*b* can be formed by a conformal plating of the dielectric layer that insulates the hole 150*b*, such that there is an internal aperture 166 extending through the center of the conductive via 160*b*. As shown in FIG. 8A, the internal aperture 166 is filled with a dielectric material 167. In one example, the internal aperture 166 can be left open.

The microelectronic unit 110 includes a terminal 124*b* formed inside of an aperture 174*b* defined in a dielectric region 170. The terminal 124*b* defines a frusto-conical shape, rather than the cylindrical shape defined by the terminal 124*a* or the terminal 24 shown in FIG. 1A.

Figure 8B:
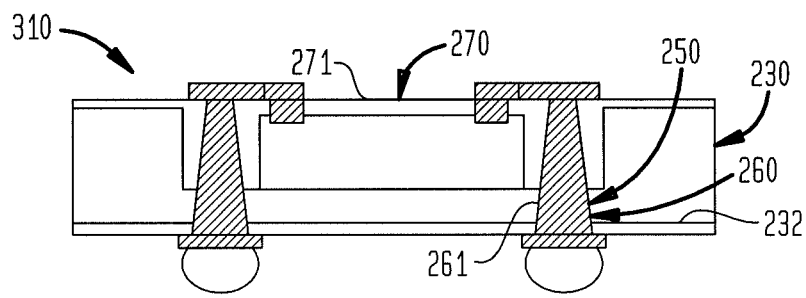
FIG. 8B is a sectional view illustrating a packaged chip in accordance with another embodiment.

FIG. 8B illustrates a microelectronic unit in accordance with another embodiment of the invention. The microelectronic unit 210 is similar to the microelectronic unit 10 described above and shown in FIG. 1A, but the microelectronic unit 210 differs in the location of the holes that extend through the carrier structure and the conductive vias that extend through the holes.

Rather than having holes and conductive vias extending from the rear surface through the carrier structure towards the front surface as shown in FIG. 1A, the microelectronic unit 210 includes holes 250 and conductive vias 260 that extend from a major surface 271 of a dielectric region 270 through the carrier structure 230 to the rear surface 232 thereof. Similar to the microelectronic unit 10, in the microelectronic unit 210, the conductive vias 260 are insulated from the carrier structure 230 by a dielectric layer and/or a dielectric region that surrounds an outer surface 261 of the conductive vias 260.

Figure 9A:
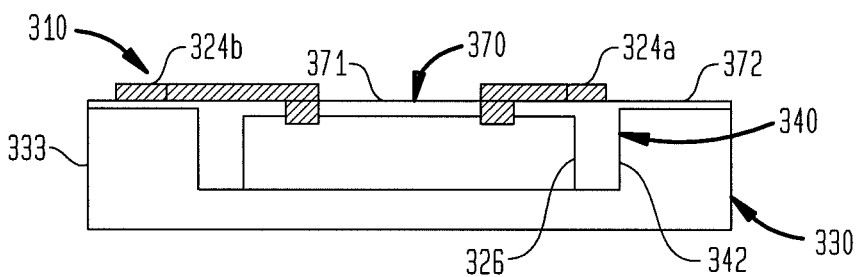
FIG. 9A is a sectional view illustrating a packaged chip in accordance with another embodiment.

FIG. 9A illustrates a microelectronic unit in accordance with another embodiment of the invention. The microelectronic unit 310 is similar to the microelectronic unit 10 described above and shown in FIG. 1A, but the microelectronic unit 310 does not include conductive vias penetrating through the carrier structure 330, and the microelectronic unit 310 includes a first terminal 324*a* or extended bond pad located in a lateral direction of a major surface 371 of a dielectric region 370 between an outer edge 326 of the microelectronic element and a lateral edge surface 342 of a recess 340 formed in the carrier structure 330. The second terminal 324*b* or extended bond pad is located in a lateral direction of the major surface 371 (or a dielectric layer 372) between the lateral edge surface 342 and an outer edge 333 of the carrier structure 330.

Figure 9B:
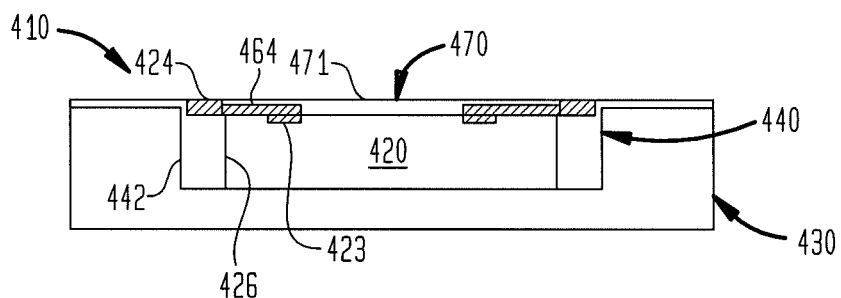
FIG. 9B is a sectional view illustrating a packaged chip in accordance with another embodiment.

FIG. 9B illustrates a microelectronic unit in accordance with another embodiment of the invention. The microelectronic unit 410 is similar to the microelectronic unit 310 described above and shown in FIG. 9A, but the microelectronic unit 410 includes terminals 424 that are only exposed at a major surface 471 of a dielectric region 470 between an outer edge 426 of a microelectronic element 420 (i.e., a sidewall of the microelectronic element 420) and a lateral edge surface 442 of a recess 440 formed in the carrier structure 430. The microelectronic unit 410 includes conductive traces 464 that extend through the dielectric region 470 to electrically connect conductive contacts 423 of the microelectronic element 420 to the terminals 424.

Figure 9C:
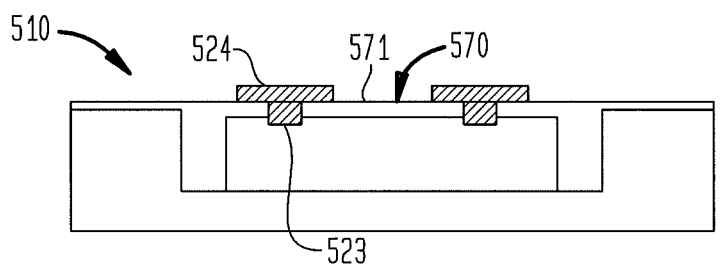
FIG. 9C is a sectional view illustrating a packaged chip in accordance with another embodiment.

FIG. 9C illustrates a microelectronic unit in accordance with another embodiment of the invention. The microelectronic unit 510 is similar to the microelectronic unit 410 described above and shown in FIG. 9B, but the microelectronic unit 510 includes terminals 524 that are in the shape of bond pads, and the terminals 524 are electrically connected to conductive contacts 523 of a microelectronic element 420 and exposed at a major surface 571 of a dielectric region 570.

FIG. 10 is a sectional view illustrating a stacked assembly including a plurality of microelectronic units similar to those described above. In the embodiment shown, a stacked assembly 600 includes a plurality of microelectronic units 610*a*, 610*b*, and 610*c* (generally 610). Although FIG. 10 includes particular examples of microelectronic units 610*a*, 610*b*, and 610*c*, any of the microelectronic units disclosed herein can be stacked to form a stacked assembly.

By providing terminals 624*b* and 624*c* exposed at the front surface of respective carrier structures 630*b* and 630*c*, and rear conductive contacts 663*a* and 663*b* at the rear surface of respective carrier structures 630*a* and 630*b*, several microelectronic units 610 can be stacked one on top of the other to form a stacked assembly 600.

In such arrangement, the rear conductive contacts 663*a* of an upper microelectronic unit 610*a* are aligned with the terminals 624*b* of a middle microelectronic unit 610*b*. Connection between respective adjacent ones of the microelectronic units 610 in the stacked assembly 600 is through conductive bond material or conductive masses 665. The dielectric layer 673 on the rear surface 632 and the dielectric layer 672 and/or dielectric region 670 on the front surface 631 provide electrical isolation between adjacent microelectronic units 610 in the stacked assembly 600 except where interconnection is provided.

As shown in FIG. 10, each carrier structure 630 can have a recess 640 having a different width. For example, as shown, the carrier structure 630*a* includes a recess 640*a* having a first width in a lateral direction along the front surface thereof, and the carrier structure 630*b* includes a recess 640*b* having a second width in the lateral direction along the front surface thereof, the second width being different than the first width. Furthermore, the microelectronic unit 610*a* includes a microelectronic element 620*a* having a different width than a microelectronic element 620*b* included in the microelectronic unit 610*b*.

The conductive masses 665 can comprise a fusible metal having a relatively low melting temperature, e.g., solder, tin, or a eutectic mixture including a plurality of metals. Alternatively, the conductive masses 665 can include a wettable metal, e.g., copper or other noble metal or non-noble metal having a melting temperature higher than that of solder or another fusible metal. Such wettable metal can be joined with a corresponding feature, e.g., a fusible metal feature of an interconnect element such as a circuit panel to externally interconnect the stacked assembly 600 to such interconnect element. In a particular embodiment, the conductive masses 665 can include a conductive material interspersed in a medium, e.g., a conductive paste, e.g., metal-filled paste, solder-filled paste or isotropic conductive adhesive or anisotropic conductive adhesive.

In one example, the conductive mass or bond material 665 can include a conductive paste such as a solder paste or other metal-filled paste or paste containing a conductive compound of a metal or combination thereof. For example, a uniform layer of solder paste can be spread over the surface of the foil. Particular types of solder paste can be used to join metal layers at relatively low temperatures. For example, indium- or silver-based solder pastes which include "nanoparticles" of metal, i.e., particles having long dimensions typically smaller than about 100 nanometers, can have sintering temperatures of about 150° C. The actual dimensions of the nanoparticles can be significantly smaller, e.g., having dimensions from about one nanometer and larger.

In particular examples, diffusion bonding or thermocompression bonding can be used to join adjacent microelectronic units 610 in place of the conductive masses 665. For example, a metal-to-metal bond between the respective microelectronic units 610 can be made without the use of solder. Instead, a bond may be formed between each rear conductive contact 663*a* and a corresponding terminal 624*b* by deforming them into engagement with each other. In such an example, the rear conductive contact 663*a* and the terminal 624*b* can be formed from a malleable material with minimal resilience or spring-back as, for example, substantially pure gold.

The rear conductive contacts 663*a* and the terminals 624*b* can be bonded together by eutectic bonding or anodic bonding between the posts and the material of the cover. For example, outer surfaces of the rear conductive contact 663*a* and the terminal 624*b* may be coated with a small amount of tin, silicon, germanium or other material which forms a relatively low-melting alloy with gold, or the rear conductive contact 663*a* and the terminal 624*b* may be formed entirely from gold or have a gold coating on their surfaces. When the rear conductive contact 663*a* and the terminal 624*b* are engaged with one another and then heated, diffusion between the material of the rear conductive contact 663*a* and the terminal 624*b* and the material on the tips of the rear conductive contact 663*a* and the terminal 624*b* forms an alloy having a melting point lower than the melting points of the individual elements at the interfaces between the posts and walls. With the stacked assembly 600 held at elevated temperature, further diffusion causes the alloying element to diffuse away from the interface, into the bulk of the gold of the rear conductive contact 663*a* and the terminal 624*b*, thereby raising the melting temperature of the material at the interface and causing the interface to freeze, forming a solid connection between the microelectronic units 610*a* and 610*b*.

Figure 11A:
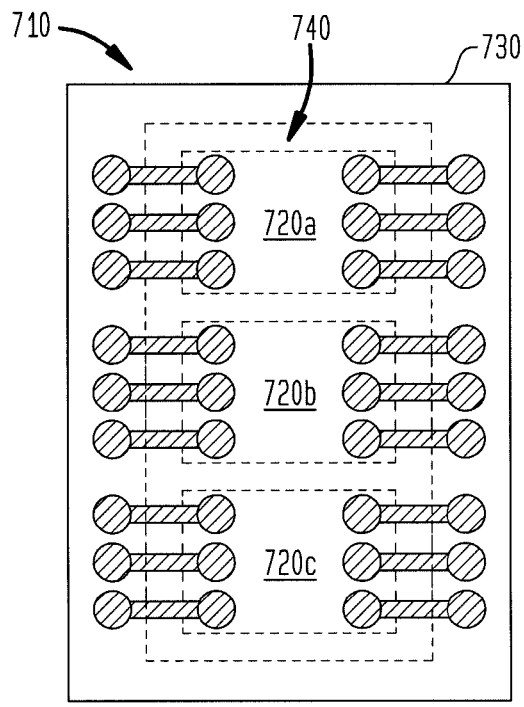
FIG. 11A is a plan view illustrating a plurality of packaged chips mounted to a single chip carrier in accordance with another embodiment.

FIG. 11A is a plan view illustrating a plurality of packaged microelectronic elements similar to those described above mounted to a single chip carrier. In the embodiment shown, a single carrier structure 730 includes a plurality of microelectronic elements 720*a*, 720*b*, and 720*c* (generally 720), each microelectronic element 720 being mounted inside of a single recess 740 formed in the carrier structure 730. Such a microelectronic unit 710 can be formed in a manner similar to that shown and described with reference to FIGS. 1-7, except that a plurality of microelectronic elements 720 are mounted into the recess 740, rather than having a one-to-one correspondence between a microelectronic element and a respective recess.

Figure 11B:
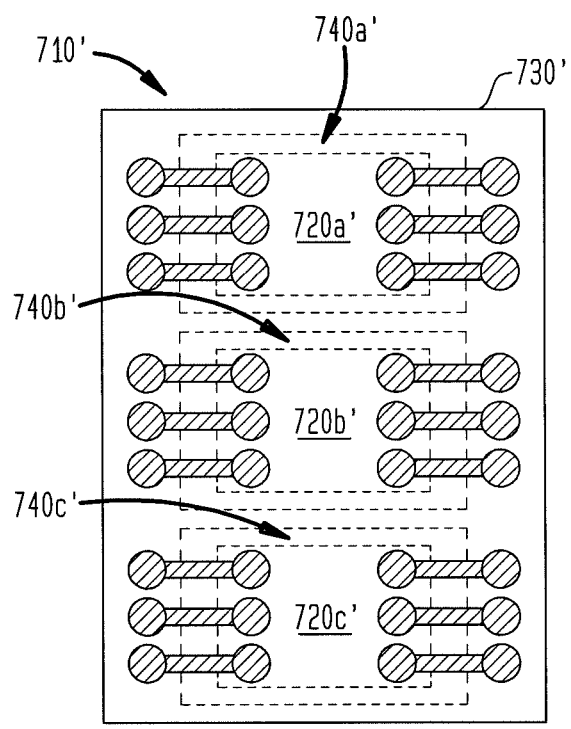
FIG. 11B is a plan view illustrating a plurality of packaged chips mounted to a single chip carrier in accordance with another embodiment.

FIG. 11B is a plan view illustrating a plurality of packaged microelectronic elements similar to those described above mounted to a single chip carrier. The microelectronic unit 110 is similar to the microelectronic unit 710 described above and shown in FIG. 11A, but the microelectronic unit 710' differs in that the microelectronic unit 710' includes a plurality of microelectronic element 720*a'*, 720*b'*, and 720*c'*, each microelectronic element 720 being mounted inside a corresponding recess 740*a'*, 740*b'*, and 740*c'* formed in a single carrier structure 730'.

Figure 12:
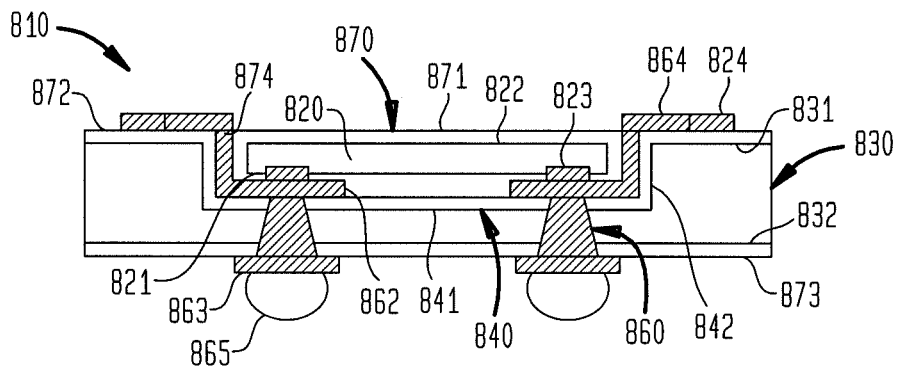
FIG. 12 is a sectional view illustrating a packaged chip and chip carrier assembly in accordance with an embodiment of the invention.

FIG. 12 illustrates a microelectronic unit in accordance with another embodiment of the invention. The microelectronic unit 110 is similar to the microelectronic unit 10 described above and shown in FIG. 1A, but the microelectronic unit 810 differs in that the microelectronic element is face-down rather than face-up, and the conductive vias extend downward from an underside of the microelectronic element.

Elements shown in FIG. 12 that are similar to those shown in FIG. 1A can be varied in similar ways as the elements shown in FIG. 1A, including, for example, different angles of the surfaces and configuration of conductive vias of the microelectronic unit 810 and different methods of forming the microelectronic unit 810 and components thereof.

As shown in FIG. 12, the microelectronic unit 810 includes a microelectronic element 820 mounted to a carrier structure 830. While not specifically shown in FIG. 12, the semiconductor devices in the active semiconductor region typically are conductively connected to the conductive contacts 823. Because the microelectronic element 820 is oriented in the face-down position, a top surface 821 faces downward and is located adjacent an inner surface 841 of a recess 840 formed in the carrier structure 830, and a bottom surface 822 remote from the top surface faces upward. The conductive contacts 823 are exposed at the top surface 821 for connection to other conductive elements.

The carrier structure 830 includes a plurality of holes 850 extending from the inner surface 841 of the recess 840 through the carrier structure 830 to the rear surface 832 thereof, and a plurality of conductive vias 860, each conductive via extending through a respective hole 850. As discussed above with reference to FIG. 1A, there can be any number of holes and conductive vias extending through the carrier structure.

Each hole 850 includes an inner surface 851 that extends through the carrier structure 830. As shown in FIG. 12, the hole 850 is tapered in a direction from the rear surface 832 to the inner surface 841 of the recess 840.

Each conductive via 860 is electrically connected to a front conductive contact 862 at the inner surface 841 of the recess 840 (but the front contact 862 is insulated from the inner surface 841 by a dielectric layer 872) and a rear conductive contact 863 at the rear surface 832. Each conductive via 860 is also insulated from the hole 850 by a dielectric layer extending along the inner surface 851 thereof (not shown).

Each conductive via 860 is also electrically connected to one or more conductive contacts 823 of the microelectronic element 820. As shown in FIG. 12, each conductive via 860 is electrically connected to a respective conductive contact 823 through the front conductive contact 862. A conductive trace 864 extends along the inner surface 841 and the lateral edge surface 842 of the recess 840 and the front surface 831 of the carrier structure 830 between the front conductive contact 862 and a terminal 824 located at the front surface 831 (but the terminal 824 is insulated from the front surface 831 by the dielectric layer 872). The combination of one or more of the terminal 824 and the conductive trace 864 can also be considered to be an "extended bond pad" that is suitable for connection to an external element (not shown).

Figure 13:
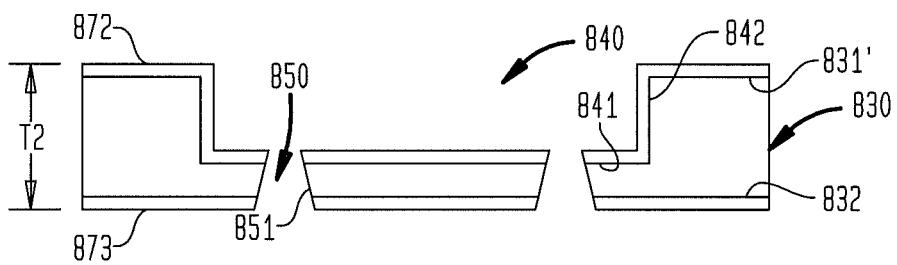
FIG. 13 is a sectional view illustrating a stage in a method of fabrication in accordance with an alternate embodiment of the invention.

A method of fabricating the microelectronic unit 810 (FIG. 12) will now be described, with reference to FIGS. 13 through 17. Referring to FIG. 13, the carrier structure 830 includes an initial front surface 831'. The recess 840 can be formed, for example, by selectively etching the carrier structure 830, after forming a mask layer, or by sandblasting or any other appropriate method. As shown in FIG. 13, the recess 840 extends downwardly from the initial front surface 831' towards the rear surface 832 of the carrier structure 830.

Next, the holes 850 can be formed in the carrier structure 830, extending from the inner surface 841 of the recess 840 to the rear surface 832 of the carrier structure. As described above with reference to FIG. 7, an etch process, sandblasting, laser drilling, mechanical milling, or any other appropriate process can be used to form the holes 850.

After forming the recess 840 and the holes 850 in the carrier structure 830, a dielectric layer 872 is deposited onto the front surface 831 of the carrier structure, onto the inner surface 841 and lateral edge surface 842 of the recess, and onto the inner surfaces 851 of the holes 850, to electrically isolate the carrier structure 830 from the microelectronic element and the conductive elements that will be added later. As described above with reference to FIG. 3A, various methods can be used to form a conformal dielectric layer 872 onto the carrier structure 830.

Also, as described above with reference to FIG. 3C, a plurality of carrier structures 830 (and the microelectronic units 810 that they will form) can be processed simultaneously by wafer-level processing, and the carrier structures 830 can be separated after formation of the microelectronic units 810.

Figure 14:
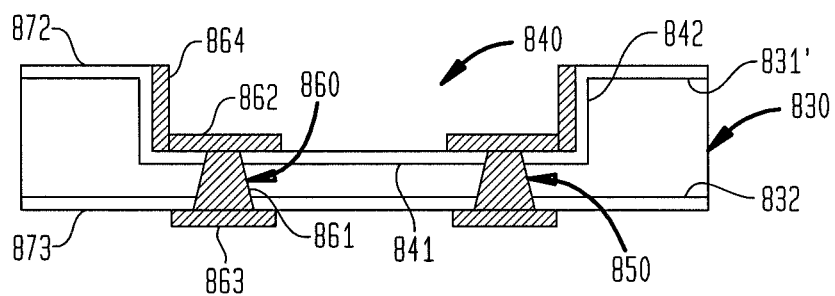
FIG. 14 is a sectional view illustrating a stage in a method of fabrication in accordance with an embodiment of the invention.

Referring now to FIG. 14, conductive vias 860 are formed within the holes 850. Each conductive via 860 is insulated from the inner surface 851 of the respective hole 850 by a dielectric layer or region (not shown, but deposited in a manner similar to that used to deposit the dielectric layer and/or region described above). The conductive vias 860 can be formed using a similar method to that described above with reference to FIG. 1A. In some embodiments, an example microelectronic unit having a face-down microelectronic element may not require formation of conductive vias (see, for example, FIG. 18C).

Then, or at the same time as forming the conductive vias 860, the conductive contacts 862 and 863 and portions of the traces 864 extending inside of the recess 840 are formed. In some embodiments, the conductive contacts 862 and 863 and the traces 864 can be formed with the conductive vias 860 during a single electroless deposition step. In other embodiments, the conductive vias 860 and the other conductive elements 862, 863, and 864 can be formed by separate electroless deposition steps.

Figure 15:
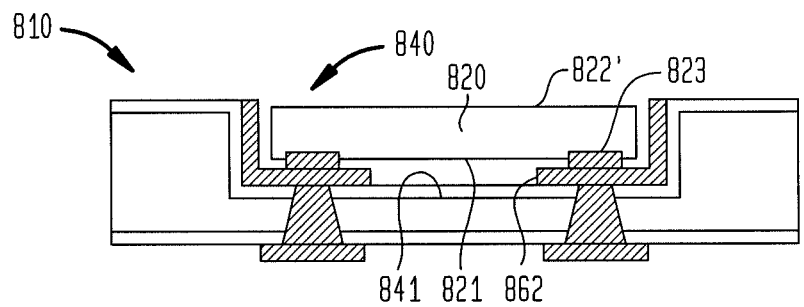
FIG. 15 is a sectional view illustrating a stage in a method of fabrication in accordance with an embodiment of the invention.

Referring now to FIG. 15, the microelectronic element 820 is mounted into the recess 840 of the carrier structure 830, such that the top surface 821 of the microelectronic element is adjacent the inner surface 841 of the recess, and the initial bottom surface 822' of the microelectronic element is facing upward. The top surface 821 of the microelectronic element 820 includes the conductive contacts 823 that face downward, towards the inner surface 841 of the recess 840. The microelectronic element 820 can be mounted into the recess 840 by bonding the conductive contacts 823 to the conductive contacts 862 using conductive bonding material or any of the other bonding methods disclosed, for example, with reference to FIG. 10.

Figure 16:
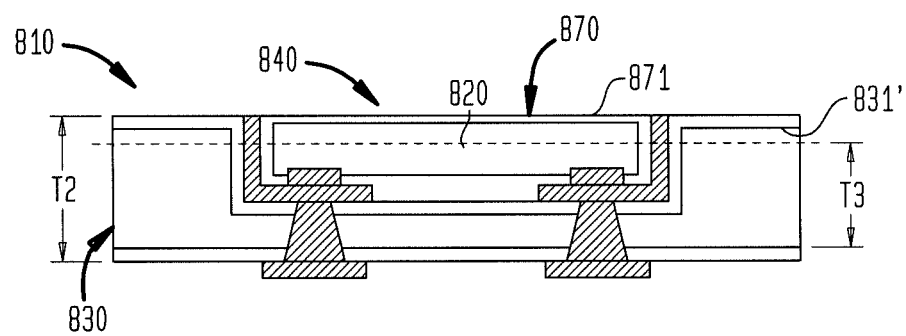
FIG. 16 is a sectional view illustrating a stage in a method of fabrication in accordance with an embodiment of the invention.

Referring now to FIG. 16, a dielectric region 870 is formed inside the recess 840. Optionally, the dielectric region 870 can be formed such that the exposed major surface 871 of the region is co-planar or substantially co-planar with the front surface 831 of the carrier structure 830 or the exposed surface of the dielectric layer 872. For example, a self-planarizing dielectric material can be deposited in the recess 840, e.g., by a dispensing or stenciling process. In another example, a grinding, lapping, or polishing process can be applied to the front surface 831 of the carrier structure 830 or the exposed surface of the dielectric layer 872 after forming the dielectric region 870 to planarize the major surface 871 of the dielectric region 870 to the front surface 831 or the exposed major surface 871 of the dielectric layer 872.

As will be discussed below, the major surface 871 of the dielectric region 870 and/or the initial front surface 831' of the carrier structure 830 can be planarized by other methods, such that the thickness of the carrier structure 830 is reduced from a thickness T2 to a thickness T3 extending between the front surface 831 and the rear surface 832.

Figure 17:
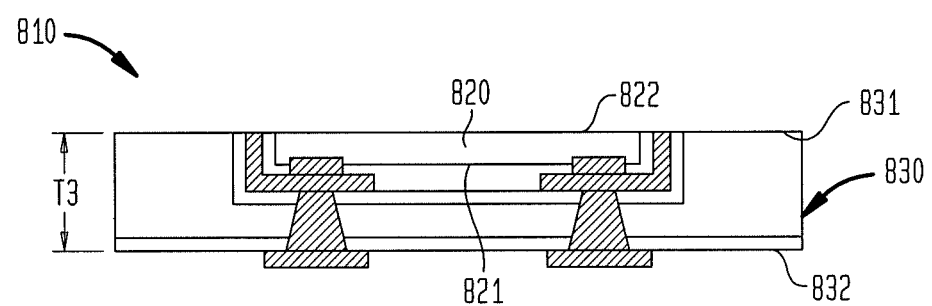
FIG. 17 is a sectional view illustrating a stage in a method of fabrication in accordance with an embodiment of the invention.

Referring now to FIG. 17, in one embodiment, a grinding process can be used, for example, to planarize the front surface 831 of the carrier structure 830 with the bottom surface 822 of the microelectronic element 820. The thickness of the carrier structure 830 is reduced from a thickness T2 to a thickness T3, and the thickness of the microelectronic element 820 is reduced by removing material from the initial bottom surface 822', thereby creating a final bottom surface 822 that is closer to the top surface 821 of the microelectronic element. For example, the thickness T2 may be about 600 μm to about 1 mm, and the thickness T3 may be about 70 μm to about 200 μm.

Then, referring back to FIG. 12, the portion of the dielectric region 870 and the dielectric layer 872 that was removed during the grinding process is reapplied to the exposed front surface 831 of the carrier structure 830 and the exposed bottom surface 822 of the microelectronic unit 820.

Then, apertures 874 are formed, extending through the dielectric region 870 to expose the ends of the vertically-extending portions of the traces 864 that extend along the lateral edge surface 842.

Once the apertures 874 are formed, the traces 864 are formed to extend along the major surface 871 of the dielectric region 870 and the dielectric layer 872 that was reapplied. The terminals 824 are formed at the top surface 871 for example, by electroless deposition, and the terminals 824 are electrically connected to the conductive contacts 823 through the conductive traces 864 and the conductive contacts 862. As discussed above with reference to FIGS. 6A, 6B, and 6C, the terminals 824 can extend to a height below, at, or above the major surface 871, such that the terminals 824 are exposed at the major surface 871 of the dielectric region 870.

Finally, if a wafer-level process was used to form the microelectronic units 810, the microelectronic units 810 can be severed from each other along dicing lanes by sawing or other dicing method to form individual microelectronic units 810.

Figure 18A:
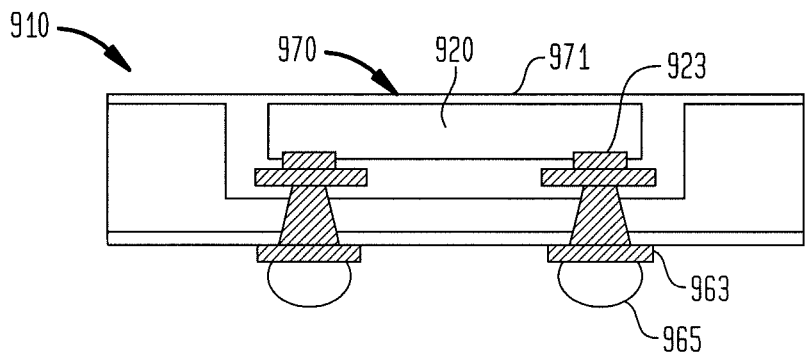
FIG. 18A is a sectional view illustrating a packaged chip in accordance with another embodiment.

FIG. 18A illustrates a microelectronic unit in accordance with another embodiment of the invention. The microelectronic unit 910 is similar to the microelectronic unit 810 described above and shown in FIG. 12, but the microelectronic unit 910 does not include traces extending through the dielectric region 970 to the major surface 971 thereof. In this embodiment, the conductive contacts 963 can be considered to be terminals, because the conductive contacts 963 are electrically connected to the conductive contacts 923 of the microelectronic element 920, and the conductive contacts 963 can be electrically connected to an external element through the conductive masses 965 or another bonding mechanism.

Figure 18B:
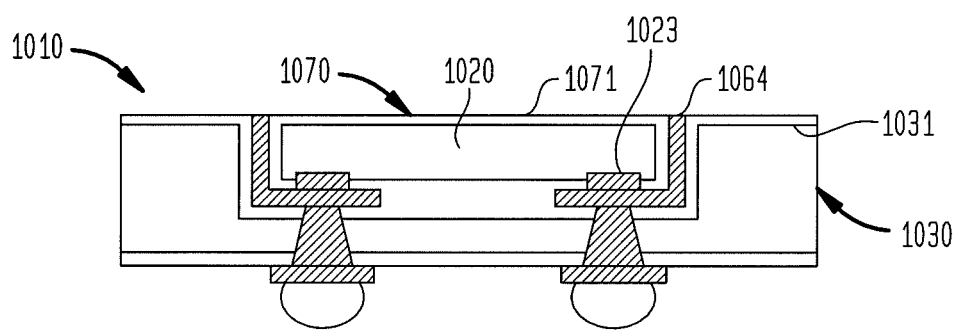
FIG. 18B is a sectional view illustrating a packaged chip in accordance with another embodiment.

FIG. 18B illustrates a microelectronic unit in accordance with another embodiment of the invention. The microelectronic unit 1010 is similar to the microelectronic unit 810 described above and shown in FIG. 12, but the conductive traces 1064 included in the microelectronic unit 1010 are exposed at the major surface 1071 of the dielectric region 1070, rather than extending onto the major surface. In this embodiment, the exposed ends of the conductive traces 1064 can be considered to be terminals, because the conductive traces 1064 are electrically connected to the conductive contacts 1023 of the microelectronic element 1020, and the conductive traces 1064 can be electrically connected to an external element through conductive masses or another bonding mechanism. As described with reference to FIGS. 6A, 6B, and 6C, the traces 1064 can extend to a height that is above, level with, or beneath the plane defined by the major surface 1071 or the plane defined by the front surface 1031 of the carrier structure 1030.

Figure 18C:
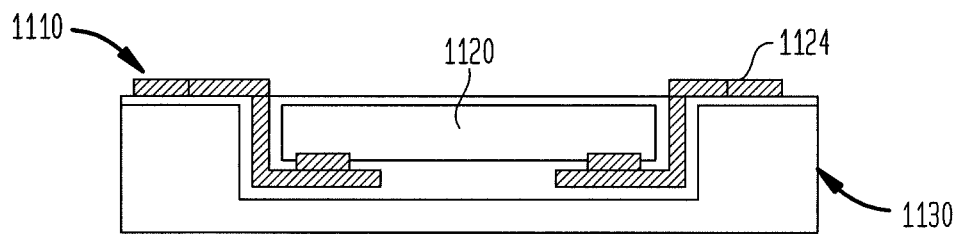
FIG. 18C is a sectional view illustrating a packaged chip in accordance with another embodiment.

FIG. 18C illustrates a microelectronic unit in accordance with another embodiment of the invention. The microelectronic unit 1110 is similar to the microelectronic unit 810 described above and shown in FIG. 12, but the microelectronic unit 1110 does not include conductive vias penetrating through the carrier structure 1130. The terminals 1124 can be electrically connected to an external element through conductive masses or another bonding mechanism. The microelectronic unit 1110 may be suitable for inclusion at the bottom of a stacked assembly, such as the microelectronic unit 610c at the bottom of the stacked assembly 600 shown in FIG. 10.

Figure 19A:
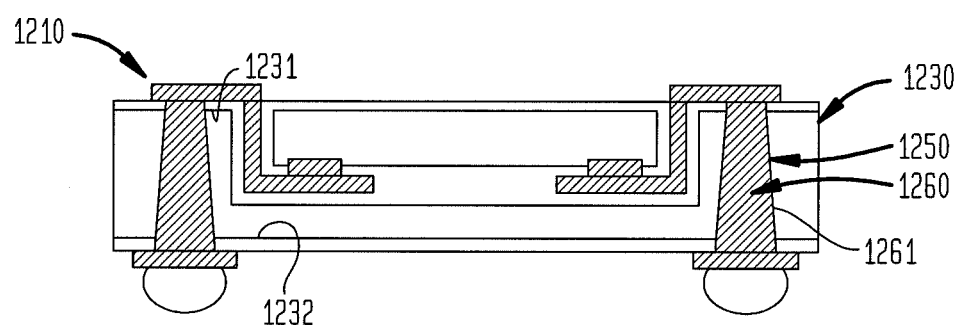
FIG. 19A is a sectional view illustrating a packaged chip in accordance with another embodiment.

FIG. 19A illustrates a microelectronic unit in accordance with another embodiment of the invention. The microelectronic unit 1210 is similar to the microelectronic unit 810 described above and shown in FIG. 12, but the microelectronic unit 1210 differs in the location of the holes that extend through the carrier structure and the conductive vias that extend through the holes.

Rather than having holes and conductive vias extending from the inner surface through the carrier structure towards the rear surface as shown in FIG. 12, the microelectronic unit 1210 includes holes 1250 and conductive vias 1260 that extend from a front surface 1231 to a rear surface 1232 of a carrier structure 1230. Similar to the microelectronic unit 810, in the microelectronic unit 1210, the conductive vias 1260 are insulated from the carrier structure 1230 by a dielectric layer and/or a dielectric region that surrounds an outer surface 1261 of the conductive vias 1260.

Figure 19B:
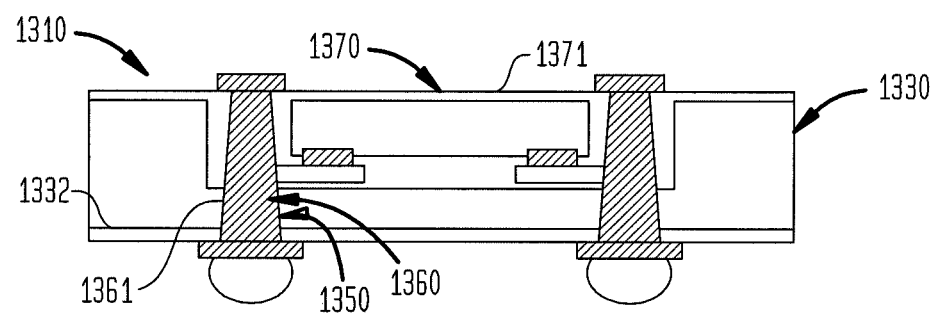
FIG. 19B is a sectional view illustrating a packaged chip in accordance with another embodiment.

FIG. 19B illustrates a microelectronic unit in accordance with another embodiment of the invention. The microelectronic unit 1310 is similar to the microelectronic unit 810 described above and shown in FIG. 12, but the microelectronic unit 1310 differs in the location of the holes that extend through the carrier structure and the conductive vias that extend through the holes.

Rather than having holes and conductive vias extending from the inner surface through the carrier structure towards the rear surface as shown in FIG. 12, the microelectronic unit 1310 includes holes 1350 and conductive vias 1360 that extend from a major surface 1371 of a dielectric region 1370 through a carrier structure 1330 to a rear surface 1332 thereof. Similar to the microelectronic unit 810, in the microelectronic unit 1310, the conductive vias 1360 are insulated from the carrier structure 1330 by a dielectric layer and/or a dielectric region that surrounds an outer surface 1361 of the conductive vias 1360.

Figure 20:
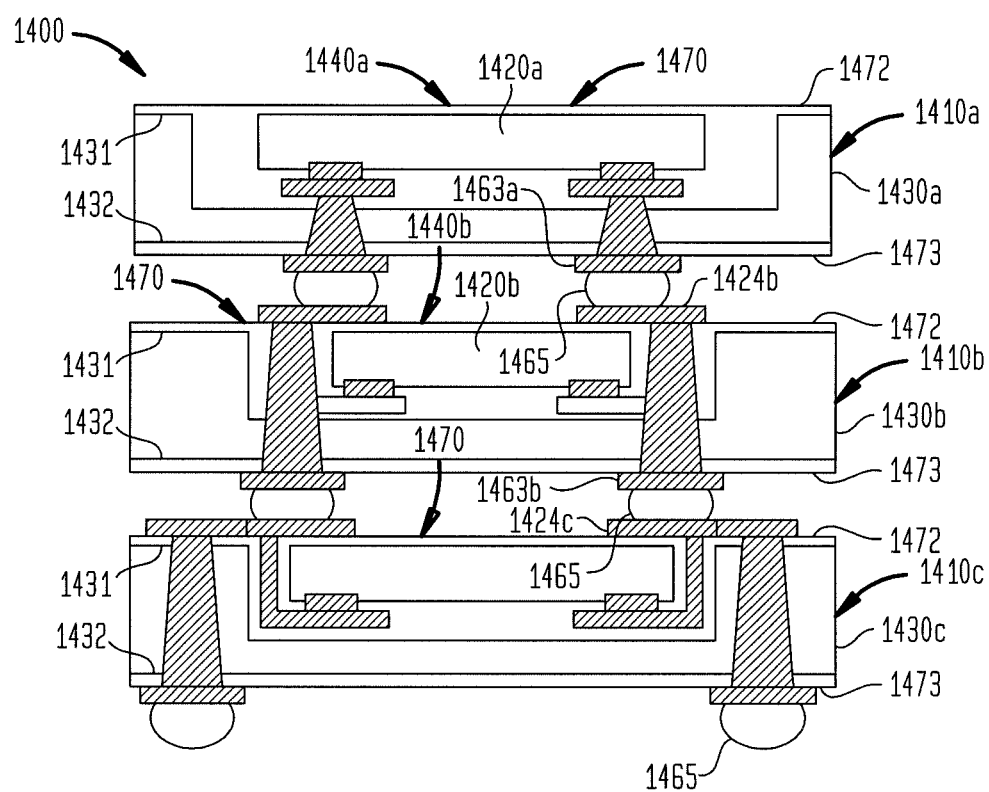
FIG. 20 is a sectional view illustrating a stacked assembly including a plurality of packaged chips in accordance with another embodiment.

FIG. 20 is a sectional view illustrating a stacked assembly including a plurality of microelectronic units similar to those described above in FIGS. 12 through 19B. In the embodiment shown, a stacked assembly 1400 includes a plurality of microelectronic units 1410a, 1410b, and 1410c (generally 1410). Although FIG. 20 includes particular examples of microelectronic units 1410a, 1410b, and 1410c, any of the microelectronic units disclosed herein can be stacked to form a stacked assembly.

By providing terminals 1424b and 1424c exposed at the front surface of respective carrier structures 1430b and 1430c, and rear conductive contacts 1463a and 1463b at the rear surface of respective carrier structures 1430a and 1430b, several microelectronic units 1410 can be stacked one on top of the other to form a stacked assembly 1400.

In such arrangement, the rear conductive contacts 1463a of an upper microelectronic unit 1410a are aligned with the terminals 1424b of a middle microelectronic unit 1410b. Connection between respective adjacent ones of the microelectronic units 1410 in the stacked assembly 1400 is through conductive bond material or conductive masses 1465. In other examples, adjacent microelectronic units 1410 may be bonded in other ways, such as using diffusion bonding or any other appropriate bonding mechanism such as those discussed above with reference to FIG. 10. The dielectric layer 1473 on the rear surface 1432 and the dielectric layer 1472 and/or dielectric region 1470 on the front surface 1431 provide electrical isolation between adjacent microelectronic units 1410 in the stacked assembly 1400 except where interconnection is provided.

As shown in FIG. 20, each carrier structure 1430 can have a recess 1440 having a different width. For example, as shown, the carrier structure 1430a includes a recess 1440a having a first width in a lateral direction along the front surface thereof, and the carrier structure 1430b includes a recess 1440b having a second width in the lateral direction along the front surface thereof, the second width being different than the first width. Furthermore, the microelectronic unit 1410a includes a microelectronic element 1420a having a different width than a microelectronic element 1420b included in the microelectronic unit 1410b.

Figure 21:
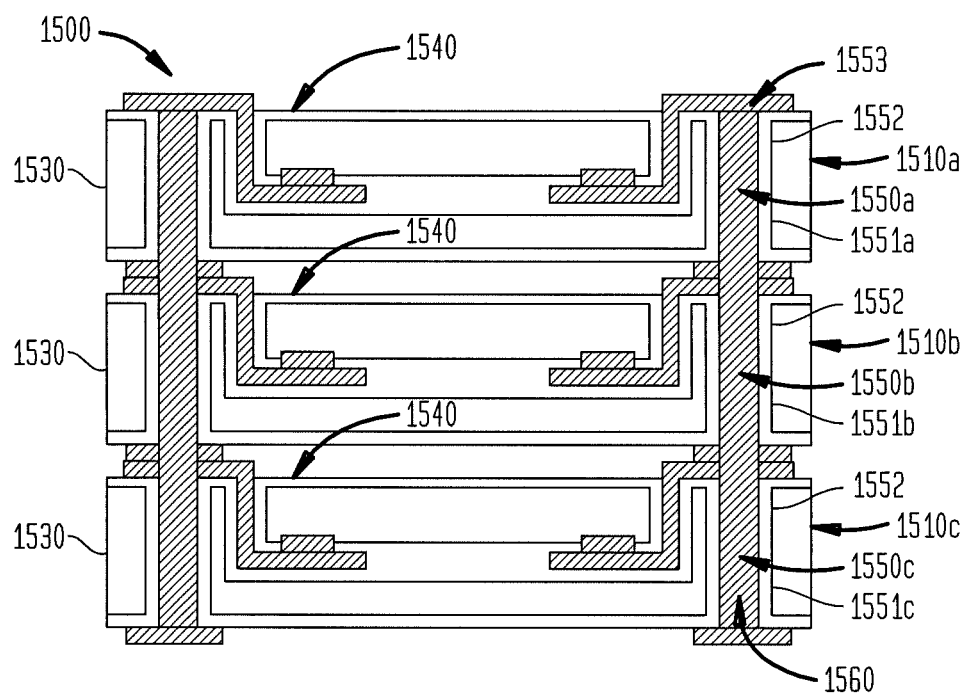
FIG. 21 is a sectional view illustrating a stacked assembly including a plurality of packaged chips in accordance with another embodiment.

FIG. 21 is a sectional view illustrating a stacked assembly including a plurality of microelectronic units similar to those described above in FIGS. 12 through 19B. In the embodiment shown, a stacked assembly 1500 includes a plurality of microelectronic units 1510a, 1510b, and 1510c (generally 1510). The stacked assembly 1500 is similar to the stacked assembly 1400 described above and shown in FIG. 20, but the stacked assembly 1500 differs in the location and shape of the holes that extend through the carrier structure, the formation and shape of the conductive vias that extend through the holes, and the method of electrically connecting the microelectronic units 1510 together.

Rather than forming holes through each carrier structure separately and connecting adjacent ones of the microelectronic units in the stacked assembly through conductive bond material or conductive masses as shown in FIG. 20, in the stacked assembly 1500, the holes in a vertical stack of adjacent microelectronic units 1510 are formed during a single process, and the conductive vias in adjacent microelectronic units 1510 are plated in a single process.

In the embodiment shown in FIG. 21, the microelectronic units 1510 are vertically stacked, and then the cylindrical-shaped holes 1550a, 1550b, and 1550c are drilled through the respective microelectronic units 1510a, 1510b, and 1510c in a single drilling operation. In particular examples, the holes 1550 can be created by etching or any other appropriate process.

After the holes 1550 are formed, a dielectric layer or region 1552 is applied to the inside surfaces 1551a, 1551b, and 1551c of the respective holes 1550a, 1550b, and 1550c, or filled inside the respective holes, and, if necessary, an aperture 1553 is drilled through the dielectric layer or region 1552.

Next, a single conductive via 1560 is plated inside a respective aperture 1553. The conductive via 1560 extends through all of the vertically stacked microelectronic units 1510, thereby mechanically and electrically connecting the microelectronic units together.

As discussed above with reference to FIG. 1A, the conductive via 1560 can be formed either solid or hollow depending upon the process conditions. For example, the conductive via 1560 can be formed by a conformal plating of the dielectric layer or region 1552 that insulates the holes 1550, such that there is an internal aperture extending through the center of the conductive via 1560. This internal aperture can be filled with a dielectric material, or it can be left open.

As discussed above with reference to FIGS. 10 and 20, each carrier structure 1530 can have a recess 1540 having a different width compared to the recess of any other carrier structure in the stacked assembly 1500. Furthermore, each microelectronic unit 1510 can include a microelectronic element 1520 having a different width than a microelectronic element included in any other microelectronic unit in the stacked assembly 1500. Microelectronic elements 1520 having various widths can be incorporated into a stack of carrier structures 1530 having a common width, for example, by including differently sized recesses in particular carrier structures 1530 or applying different trace routings onto particular carrier structures 1530, as shown, for example, in FIG. 20.

Figure 22:
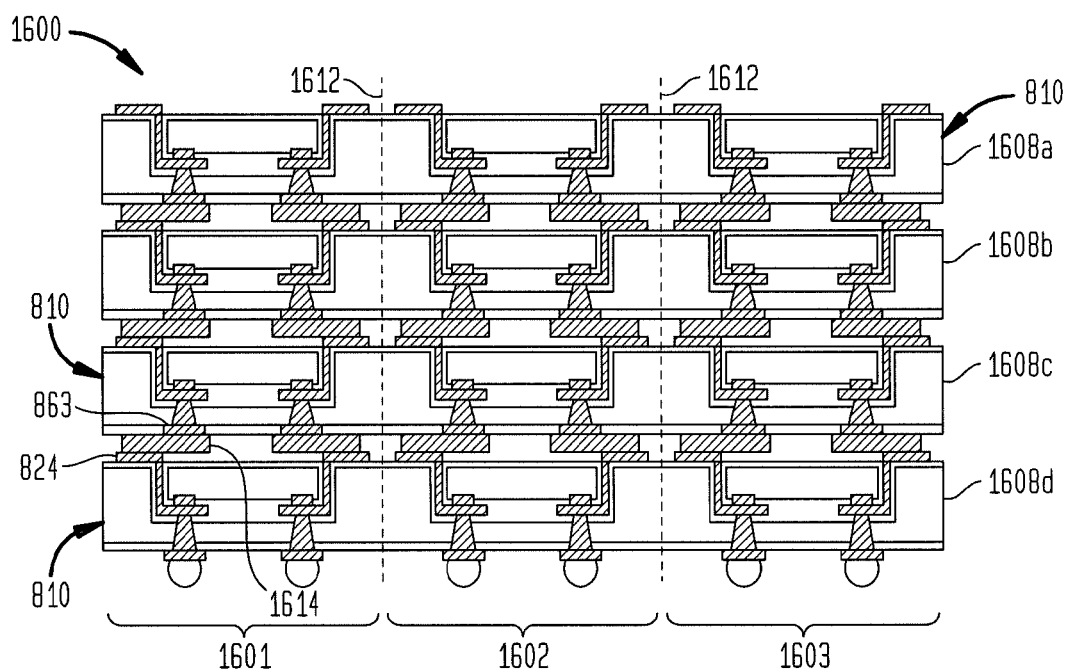
FIG. 22 is a sectional view illustrating a stacked wafer-level assembly including a plurality of packaged chips in accordance with another embodiment.

FIG. 22 is a sectional view illustrating a stacked wafer-level assembly including a plurality of packaged chips in accordance with another embodiment. As discussed above with reference to FIG. 3C, the carrier structures and the microelectronic units that they will form can be processed simultaneously by wafer-level processing, i.e., by processing performed simultaneously to a plurality of carrier structures 30 while they remain joined together as a portion of a wafer or as an entire semiconductor or metal wafer. After fabrication of the microelectronic units is completed, the wafer can be severed along dicing lanes into individual packaged microelectronic units.

As illustrated in FIG. 22, a stacked assembly of wafers 1600 includes wafers 1608a, 1608b, 1608c, and 1608d (or generally 1608). Each wafer 1608 includes a plurality of microelectronic units 810 (FIG. 12), the microelectronic unit 810 formed according to the process discussed above with reference to FIGS. 12-17.

Each microelectronic unit 810 of each wafer 1608 can be connected to an adjacent microelectronic unit 810 in a vertical direction of the figure through a relatively short electrical connection, which may be advantageous compared to longer electrical connections between microelectronic devices in conventional stacking configurations. As shown in FIG. 22, the rear conductive contact 863 of an upper microelectronic unit 810 is electrically connected to a terminal 824 of a lower microelectronic unit 810 through a conductive interconnect element 1614.

Each conductive interconnect element 1614 can be connected to a rear conductive contact 863 of an upper microelectronic unit 810 and a terminal 824 of a lower microelectronic unit 810, for example, with a bond metal such as tin or solder, etc., diffusion bonding, thermocompression bonding, an anisotropic conductive adhesive, or any other appropriate bonding mechanism or material. In a particular embodiment, the conductive interconnect elements 1614 can be included in a redistribution layer that is configured to connect an upper wafer 1608 with a lower wafer 1608.

Although the wafers 1608 are shown in FIG. 22 as electrically connected together by the conductive interconnect elements 1614, in an example embodiment, the conductive interconnect elements 1614 can be omitted. In such an embodiment, a rear conductive contact 863 can be directly electrically connected to a terminal 824 without the use of a conductive interconnect element 1614, for example, where the conductive contact 863 and/or the terminal 824 is in the form of an extended bond pad and are aligned so that the rear conductive contacts and the terminals confront one another.

In some embodiments, every terminal of a particular microelectronic unit 810 (e.g., each terminal 824 or conductive contact 862 located at the front side 831 of the carrier structure 830, or each conductive contact 863 located at the rear surface 832) need not be connected to a corresponding terminal of an adjacent microelectronic unit 810.

The wafers 1608a, 1608b, 1608c, and 1608d can be stacked and electrically connected together as described above with reference to FIG. 10, 20, or 21. After the wafers 1608 are connected together, individual stacked assemblies 1601, 1602, and 1603 can be created by cutting apart the stacked assemblies along dicing lanes 1612 that are located at the boundaries between individual microelectronic units 810.

As discussed above with reference to FIGS. 10, 20, and 21, each microelectronic unit 810 in a particular stacked assembly 1601, 1602, or 1603 can include a recess 840 having a different width compared to the recess of any other carrier structure in its stacked assembly. Furthermore, each microelectronic unit 810 can include a microelectronic element 820 having a different width than a microelectronic element included in any other microelectronic unit in its stacked assembly.

A method of fabricating a microelectronic unit 1710 will now be described, with reference to FIGS. 23A through 25. The method shares the same initial steps shown and described above with reference to FIGS. 2-7, except that rather than finish the method by performing the steps described above with reference to FIG. 1A, the steps described below are performed.

Figure 23A:
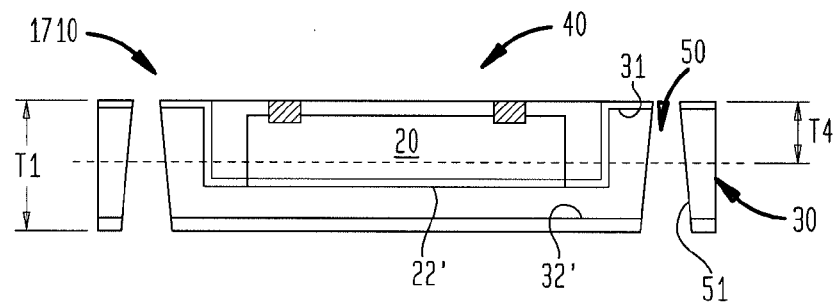
FIG. 23A is a sectional view illustrating a stage in a method of fabrication in accordance with an embodiment of the invention.
Figure 24:
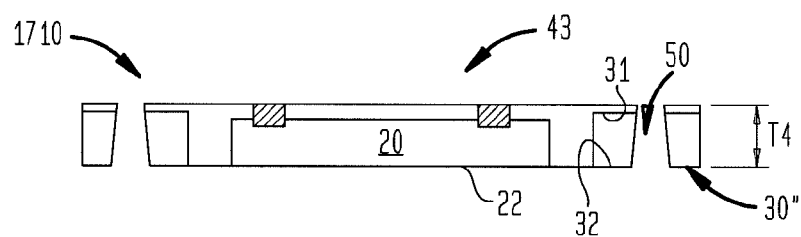
FIG. 24 is a sectional view illustrating a stage in a method of fabrication in accordance with an embodiment of the invention.

Referring now to FIGS. 23A and 24, a grinding, polishing, or etching process can be used, for example, to planarize the initial rear surface 32' of the carrier structure 30 with the initial bottom surface 22' of the microelectronic element 20. The thickness of the carrier structure 30 can be reduced from an initial thickness T1 to a thickness T4, and the thickness of the microelectronic element 20 can be reduced by removing material from the initial bottom surface 22', thereby creating a final bottom surface 22 that is closer to the top surface 21 of the microelectronic element 20. For example, the thickness T1 may be about 600 μm to about 1 mm, and the thickness T4 may be about 70 μm to about 200 μm.

Figure 23B:
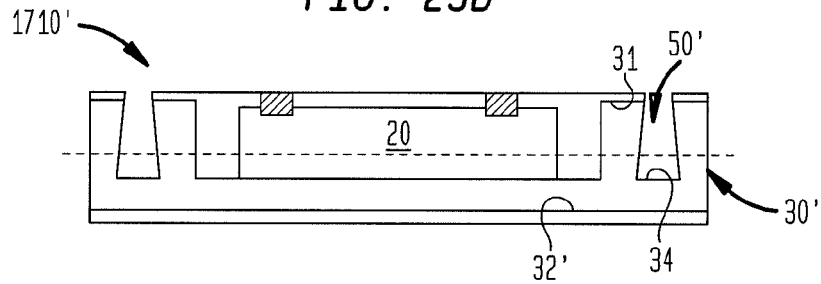
FIG. 23B is a sectional view illustrating a stage in a method of fabrication in accordance with an embodiment of the invention.

In an alternate embodiment of the stage of fabricating the microelectronic unit 1710 shown in FIG. 23A, the microelectronic unit 1710' shown in FIG. 23B can be created before the grinding, polishing, or etching process is performed. In the embodiment shown in FIG. 23B, each hole 50' can extend from the front surface 31 through the carrier structure 30' to a bottom surface 34 that is beneath the initial rear surface 32'. The holes 50' are shown having a reentrant shape in which their widths are greater at the bottom surfaces 34 therein than at the front surface 31. In other examples, the holes 50' can have the same widths at the front and bottom surfaces, or can have larger widths at their front surface than at their bottom surfaces.

After planarizing the carrier structure 30' by grinding, polishing, or etching the initial rear surface 32', the holes 50' are exposed at the rear surface 32 such that the holes completely extend through the carrier structure as shown in FIG. 24. In a particular example, the holes can extend from the rear surface through the carrier structure to a location that is beneath the initial front surface, such that after the step of planarizing the top surface, the holes are exposed at the top surface of the carrier structure. The steps of forming holes that extend partially through the carrier structure and exposing the holes during a planarizing step can be applied to any of the carrier structure embodiments disclosed herein.

Figure 25:
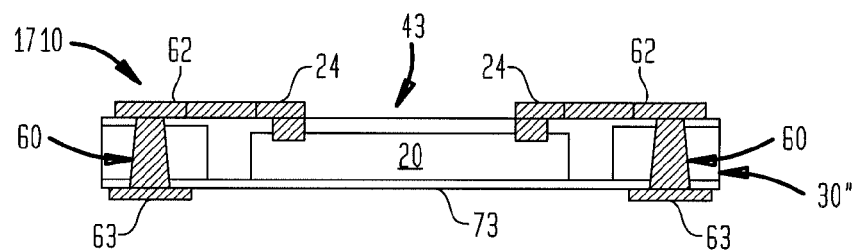
FIG. 25 is a sectional view illustrating a stage in a method of fabrication in accordance with an embodiment of the invention.

As shown in FIGS. 24 and 25, a carrier structure 30" is created that has an opening 43 extending completely through the carrier structure 30" from the front surface 31 to the rear surface 32, rather than the recess 40 shown in FIG. 1A that has an inner surface at the bottom of the recess 40. In a particular embodiment, the carrier structure 30" can be formed having a ring shape including an opening 43, rather than creating the opening 43 by grinding, polishing, or etching an initial rear surface 32' of a carrier structure 30.

Then, referring to FIG. 25, a dielectric layer 73 is applied to the rear surface 32 of the carrier structure 30, and conductive vias 60 are formed within the holes 50. Each conductive via 60 is insulated from the inner surface 51 of the respective hole 50 by a dielectric layer or region (not shown, but deposited in a manner similar to that used to deposit the dielectric layers and/or regions described above with respect to other embodiments).

Then, the traces 64 and conductive contacts 62 and 63 are formed to electrically connect the terminals 24 to the conductive vias 60. In some embodiments, the conductive contacts 62 and 63 and the traces 64 can be formed with the conductive vias 60 during a single electroless deposition step. In other embodiments, the conductive vias 60 and the other conductive elements 62, 63, and 64 can be formed by separate electroless deposition steps.

The methods disclosed herein for forming microelectronic units can be applied to a microelectronic substrate, such as a single carrier structure, or can be applied simultaneously to a plurality of carrier structures which can be held at defined spacings in a fixture or on a carrier for simultaneous processing. Alternatively, the methods disclosed herein can be applied to a carrier structure or element including a plurality of carrier structures that are attached together in form of a wafer or portion of a wafer to perform processing as described above simultaneously with respect to a plurality of carrier structures on a wafer-level, panel-level or strip-level scale.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory.

Figure 26:
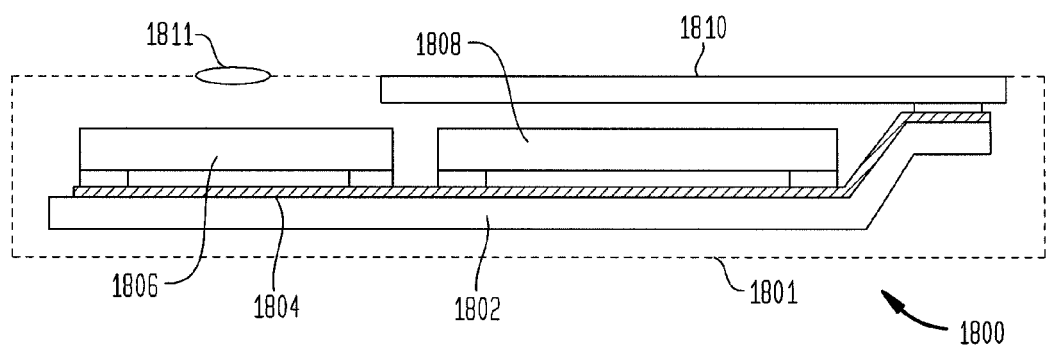
FIG. 26 is a schematic depiction of a system according to one embodiment of the invention.

The structures discussed above can be utilized in construction of diverse electronic systems. For example, a system 1800 in accordance with a further embodiment of the invention includes a structure 1806 as described above in conjunction with other electronic components 1808 and 1810. In the example depicted, component 1808 is a semiconductor chip whereas component 1810 is a display screen, but any other components can be used. Of course, although only two additional components are depicted in FIG. 26 for clarity of illustration, the system may include any number of such components. The structure 1806 as described above may be, for example, a microelectronic unit as discussed above in connection with FIGS. 1A and 1B, or a structure incorporating plural microelectronic units as discussed with reference to FIG. 10. In a further variant, both may be provided, and any number of such structures may be used.

Structure 1806 and components 1808 and 1810 are mounted in a common housing 1801, schematically depicted in broken lines, and are electrically interconnected with one another as necessary to form the desired circuit. In the exemplary system shown, the system includes a circuit panel 1802 such as a flexible printed circuit board, and the circuit panel includes numerous conductors 1804, of which only one is depicted in FIG. 26, interconnecting the components with one another. However, this is merely exemplary; any suitable structure for making electrical connections can be used.

The housing 1801 is depicted as a portable housing of the type usable, for example, in a cellular telephone or personal digital assistant, and screen 1810 is exposed at the surface of the housing. Where structure 1806 includes a light-sensitive element such as an imaging chip, a lens 1811 or other optical device also may be provided for routing light to the structure. Again, the simplified system shown in FIG. 26 is merely exemplary; other systems, including systems commonly regarded as fixed structures, such as desktop computers, routers and the like can be made using the structures discussed above.

The vias and via conductors disclosed herein can be formed by processes such as those disclosed in greater detail in the co-pending, commonly assigned U.S. patent applications entitled "MICROELECTRONIC ELEMENTS HAVING METALLIC PADS OVERLYING VIAS," "MICROELECTRONIC ELEMENTS WITH REAR CONTACTS CONNECTED WITH VIA FIRST OR VIA MIDDLE STRUCTURES," "METHODS OF FORMING SEMICONDUCTOR ELEMENTS USING MICRO-ABRASIVE PARTICLE STREAM," "NON-LITHOGRAPHIC FORMATION OF THREE-DIMENSIONAL CONDUCTIVE ELEMENTS," and "ACTIVE CHIP ON CARRIER OR LAMINATED CHIP HAVING MICROELECTRONIC ELEMENT EMBEDDED THEREIN," filed on even date herewith, and in published U.S. Patent Application Publication No. 2008/0246136, the disclosures of which are incorporated by reference herein.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic assembly including at least first and second stackable microelectronic units, each stackable microelectronic unit comprising:

a carrier structure having a front surface, a rear surface remote from the front surface, and a recess having an opening at the front surface and an inner surface located below the front surface of the carrier structure, the carrier structure being made from semiconductor material;

a plurality of conductive vias extending in a direction from the rear surface to the front surface of the carrier structure;

a microelectronic element having a bottom surface adjacent the inner surface, a top surface remote from the bottom surface and the top surface facing away from the carrier structure, and a plurality of contacts at the top surface;

rear terminals exposed at the rear surface of the carrier structure, and front terminals coupled with the rear terminals through the conductive vias, the front terminals coupled with the contacts of the microelectronic element; and a dielectric region contacting the top surface of the microelectronic element, the dielectric region having a planar surface located coplanar with or above the front surface of the carrier structure, wherein the front terminals are exposed at the surface of the dielectric region, wherein the dielectric region extends between sidewalls of the recess and the microelectronic element, wherein the first microelectronic unit is stacked with the second microelectronic unit such that the front terminals of one of the first or second microelectronic units face and are joined with the corresponding front terminals or rear terminals of another of the first or second microelectronic units, such that the contacts of the respective microelectronic elements therein are coupled through the conductive vias of at least one of the first or second microelectronic units and the joined terminals, wherein the recesses of the first and second microelectronic units have respective different widths in a first direction parallel to the respective front surface, and widths of the microelectronic elements of the respective microelectronic units in the first direction are different from one another, and wherein the carrier structures of the first and second microelectronic units have a same width in the first direction.

2. A microelectronic assembly as claimed in claim 1, wherein the front terminals of each microelectronic unit are exposed at the front surface of the carrier structure of the respective microelectronic unit.

3. A microelectronic assembly as claimed in claim 2, wherein the front terminals of each microelectronic unit extend above the front surface of the carrier structure of the respective microelectronic unit.

4. A microelectronic assembly as claimed in claim 1, wherein the microelectronic element of at least one of the microelectronic units has at least one edge surface between the respective top and bottom surfaces, and a location of at least one of the front terminals of the at least one of the microelectronic units in a lateral direction of the respective planar surface is between the edge surface of the respective microelectronic element and a sidewall of the sidewalls of the respective recess.

5. A microelectronic assembly as claimed in claim 1, wherein the front terminals of each microelectronic unit include conductive bond pads.

6. A microelectronic assembly as claimed in claim 1, wherein the front terminals of each microelectronic unit include extended bond pads, the extended bond pads contacting the contacts of the respective microelectronic element.

7. A microelectronic assembly as claimed in claim 1, wherein the carrier structure of at least one of the microelectronic units includes an outer metal finish layer, such that the carrier structure of the at least one of the microelectronic units is adapted to function as a heat spreader.

8. A microelectronic assembly as claimed in claim 1, wherein a dielectric material of each microelectronic unit covers the entire front surface of the respective carrier structure.

9. A microelectronic assembly as claimed in claim 1, wherein the dielectric region of each microelectronic unit is an electrochemically deposited polymer.

10. A microelectronic assembly as claimed in claim 1, wherein each conductive via of at least one of the microelectronic units has a first width at the rear surface of the respective carrier structure and a second width at an opposite end, the second width being different than the first width.

11. A microelectronic assembly as claimed in claim 1, wherein the front terminals at least one of the microelectronic units include extended bond pads, and each bond pad electrically connects a respective conductive via with a respective contact of the respective microelectronic element.

12. A microelectronic assembly as claimed in claim 1, wherein the microelectronic element of at least one of the microelectronic units is a first microelectronic element, the at least one of the microelectronic units further comprising a second microelectronic element having a bottom surface adjacent the inner surface of the respective recess, a top surface remote from the bottom surface, and a plurality of contacts exposed at the top surface.

13. A microelectronic assembly as claimed in claim 1, wherein the recess of at least one of the microelectronic units is a first recess, the microelectronic element of the at least one of the microelectronic units is a first microelectronic element, and the carrier structure of the at least one of the microelectronic units has a second recess having an opening at the respective front surface and an inner surface located below the front surface of the respective carrier structure, the at least one of the microelectronic units further comprising a second microelectronic element having a bottom surface adjacent the inner surface of the second recess, a top surface remote from the bottom surface, and a plurality of contacts exposed at the top surface.

14. A system comprising a microelectronic assembly according to claim 1 and one or more other electronic components electrically connected to the microelectronic assembly.

15. A system as claimed in claim 14, further comprising a housing, said microelectronic assembly and said other electronic components being mounted to said housing.

16. A microelectronic assembly as claimed in claim 1, wherein the front terminals of the one of the first or second microelectronic units are joined with the corresponding front terminals or rear terminals of the another of the first or second microelectronic units through a conductive bond material.

17. A microelectronic assembly as claimed in claim 1, wherein the microelectronic element of one of the first or second microelectronic units is a memory chip, and the microelectronic element of another of the first or second microelectronic units is other than a memory chip.

18. A microelectronic assembly as claimed in claim 1, wherein the microelectronic element of one of the first or second microelectronic units includes a memory chip of a first type, and the microelectronic element of another of the first or second microelectronic units includes a memory chip of a second type different than the first type.

19. A microelectronic assembly as claimed in claim 1, wherein the microelectronic element of one of the first or second microelectronic units is a processor chip, and the microelectronic element of another of the first or second microelectronic units is other than a processor chip.

20. A microelectronic assembly as claimed in claim 1, wherein the microelectronic element of one of the first or second microelectronic units has an image sensor, and the microelectronic element of another of the first or second microelectronic units has a processor used to process an image from the image sensor.

21. A microelectronic assembly including at least first and second stackable microelectronic units, each stackable microelectronic unit comprising:

a carrier structure having a front surface, a rear surface remote from the front surface, and a recess having an opening at the front surface and an inner surface located below the front surface of the carrier structure, the carrier structure being made from semiconductor material;

a plurality of conductive vias extending in a direction from the rear surface to the front surface of the carrier structure;

a microelectronic element having a bottom surface adjacent the inner surface, a top surface remote from the bottom surface and the top surface facing away from the carrier structure, and a plurality of contacts at the top surface;

rear terminals exposed at the rear surface of the carrier structure, and front terminals coupled with the rear terminals through the conductive vias, the front terminals coupled with the contacts of the microelectronic element; and a dielectric region contacting the top surface of the microelectronic element, the dielectric region having a planar surface located coplanar with or above the front surface of the carrier structure, wherein the front terminals are exposed at the surface of the dielectric region, wherein the dielectric region extends between sidewalls of the recess and the microelectronic element, wherein the first microelectronic unit is stacked with the second microelectronic unit such that the front terminals of one of the first or second microelectronic units face and are joined with the corresponding front terminals or rear terminals of another of the first or second microelectronic units, such that the contacts of the respective microelectronic elements therein are coupled through the conductive vias of at least one of the first or second microelectronic units and the joined terminals, wherein the recess of the first microelectronic unit and the recess of the second microelectronic unit are sized to receive microelectronic elements of different respective sizes therein, and wherein the microelectronic element of the first microelectronic unit is configured to perform at least one function different from that of the microelectronic element of the second microelectronic unit.

22. A microelectronic assembly as claimed in claim 21, wherein the carrier structures of the first and second microelectronic units have a same width in the first direction.

23. A microelectronic assembly as claimed in claim 21, wherein the front terminals of the one of the first or second microelectronic units are joined with the corresponding front terminals or rear terminals of the another of the first or second microelectronic units through a conductive bond material.

24. A microelectronic assembly as claimed in claim 21, wherein the microelectronic element of one of the first or second microelectronic units is a memory chip, and the microelectronic element of another of the first or second microelectronic units is other than a memory chip.

25. A microelectronic assembly as claimed in claim 21, wherein the microelectronic element of one of the first or second microelectronic units is a processor chip, and the microelectronic element of another of the first or second microelectronic units is other than a processor chip.

26. A microelectronic assembly as claimed in claim 21, wherein the microelectronic element of one of the first or second microelectronic units has an image sensor, and the microelectronic element of another of the first or second microelectronic units has a processor used to process an image from the image sensor.

27. A microelectronic assembly including at least first and second stackable microelectronic units, each stackable microelectronic unit comprising:

a carrier structure having a front surface, a rear surface remote from the front surface, and a recess having an opening at the front surface and an inner surface located below the front surface of the carrier structure, the carrier structure being made from semiconductor material;

a plurality of conductive vias extending in a direction from the rear surface to the front surface of the carrier structure;

a microelectronic element having a bottom surface adjacent the inner surface, a top surface remote from the bottom surface and the top surface facing away from the carrier structure, and a plurality of contacts at the top surface;

rear terminals exposed at the rear surface of the carrier structure, and front terminals coupled with the rear terminals through the conductive vias, the front terminals coupled with the contacts of the microelectronic element; and a dielectric region contacting the top surface of the microelectronic element, the dielectric region having a planar surface located coplanar with or above the front surface of the carrier structure, wherein the front terminals are exposed at the surface of the dielectric region, wherein the dielectric region extends between sidewalls of the recess and the microelectronic element, wherein the first microelectronic unit is stacked with the second microelectronic unit such that the front terminals of one of the first or second microelectronic units face and are joined with the corresponding front terminals or rear terminals of another of the first or second microelectronic units, such that the contacts of the respective microelectronic elements therein are coupled through the conductive vias of at least one of the first or second microelectronic units and the joined terminals.

28. A microelectronic assembly as claimed in claim 27, wherein the recess of the first microelectronic unit and the recess of the second microelectronic unit are sized to receive microelectronic elements of different respective sizes therein.

* * * * *